(12) United States Patent
Ibbetson et al.

(10) Patent No.: US 10,288,261 B2
(45) Date of Patent: May 14, 2019

(54) LOW PROFILE LIGHTING MODULE

(71) Applicant: CREE, INC., Durham, NC (US)

(72) Inventors: James Ibbetson, Santa Barbara, CA (US); Bernd Keller, Santa Barbara, CA (US); Eric Tarsa, Goleta, CA (US); Zongjie Yuan, Ventura, CA (US)

(73) Assignee: CREE, INC., Durham, NC (US)

( * ) Notice: Subject to any disclaimer, the term of this patent is extended or adjusted under 35 U.S.C. 154(b) by 209 days.

(21) Appl. No.: 14/696,902

(22) Filed: Apr. 27, 2015

(65) Prior Publication Data

US 2015/0338032 A1 Nov. 26, 2015

Related U.S. Application Data

(62) Division of application No. 13/842,307, filed on Mar. 15, 2013, now Pat. No. 9,054,019.
(Continued)

(51) Int. Cl.
| | |
|---|---|
| *H01L 27/15* | (2006.01) |
| *F21V 11/00* | (2015.01) |
| *F21K 9/00* | (2016.01) |
| *F21K 9/60* | (2016.01) |
| *F21V 3/00* | (2015.01) |
| *H01L 33/54* | (2010.01) |
| *F21Y 105/10* | (2016.01) |

(Continued)

(52) U.S. Cl.
CPC ............. *F21V 11/00* (2013.01); *F21K 9/00* (2013.01); *F21K 9/60* (2016.08); *H01L 27/15* (2013.01); *F21V 3/00* (2013.01); *F21Y 2103/10* (2016.08); *F21Y 2105/10* (2016.08); *F21Y 2115/10* (2016.08); *H01L 33/54* (2013.01)

(58) Field of Classification Search
None
See application file for complete search history.

(56) References Cited

U.S. PATENT DOCUMENTS

| 8,657,467 B2 | 2/2014 | Hsieh et al. |
|---|---|---|
| 2004/0212998 A1 | 10/2004 | Mohacsi |

(Continued)

FOREIGN PATENT DOCUMENTS

| WO | WO 2011010535 | 1/2011 |
|---|---|---|
| WO | WO 2012035799 | 3/2012 |

OTHER PUBLICATIONS

WhiteOpticstm White97 Film, White Optics, LLC New Castel, DE, Technical Data Sheet.
(Continued)

*Primary Examiner* — Bilkis Jahan
(74) *Attorney, Agent, or Firm* — Ferguson Case Orr Peterson LLP

(57) ABSTRACT

A low profile lighting module. Devices according to this disclosure can produce a uniform light intensity output profile, limiting the perceived appearance of individual point sources, from direct lighting modules comprising several light emitting diodes. Individual lighting device components are disclosed that can contribute to this uniform profile, including: primary optics, secondary optics, and contoured housing elements. These components can interact with and control emitted light, thus adjusting its pattern. These components can alter the direction of emitted light, providing a more uniform light intensity over a wider range of viewing angle.

35 Claims, 51 Drawing Sheets

Related U.S. Application Data

(60) Provisional application No. 61/619,370, filed on Apr. 2, 2012.

(51) Int. Cl.
*F21Y 103/10* (2016.01)
*F21Y 115/10* (2016.01)

(56) References Cited

U.S. PATENT DOCUMENTS

| | | |
|---|---|---|
| 2005/0001537 A1 | 1/2005 | West et al. |
| 2005/0219836 A1 | 10/2005 | Hung |
| 2006/0262544 A1* | 11/2006 | Piepgras ............... F21K 9/00 362/373 |
| 2006/0262545 A1* | 11/2006 | Piepgras ............... F21K 9/00 362/373 |
| 2006/0291205 A1* | 12/2006 | Jeon .................. G02B 27/0955 362/241 |
| 2007/0047254 A1 | 3/2007 | Schardt et al. |
| 2007/0194337 A1* | 8/2007 | Kondo ................ H01L 25/167 257/98 |
| 2007/0257266 A1 | 11/2007 | Leatherdale et al. |
| 2007/0257272 A1 | 11/2007 | Hutchins |
| 2008/0284943 A1 | 11/2008 | Jeong et al. |
| 2009/0251910 A1* | 10/2009 | Feit .................... B60K 35/00 362/489 |
| 2009/0283779 A1* | 11/2009 | Negley ................ F21K 9/00 257/88 |
| 2011/0042700 A1 | 2/2011 | Lenk |
| 2011/0267801 A1 | 11/2011 | Tong et al. |

OTHER PUBLICATIONS

WhiteOpticstm Metal, White Optics, LLC New Castel, DE, Technical Data Sheet.
International Search Report and Written Opinion from Appl. No. PCT/IB2013/001022. dated Oct. 4, 2013.
International Preliminary Report and Written Opinion from Appl. No. PCT/IB2013/001022. dated Oct. 16, 2014.
Office Action from U.S. Appl. No. 13/842,307, dated Jun. 24, 2014.
Office Action from U.S. Appl. No. 13/842,307, dated Sep. 4, 2014.
Response from U.S. Appl. No. 13/842,307, dated Aug. 12, 2014.
Response from U.S. Appl. No. 13/842,307, dated Dec. 1, 2014.
U.S. Appl. No. 13/345,215, filed Jan. 6, 2012, Lu, et al.
U.S. Appl. No. 13/442,311, filed Apr. 9, 2012, Lu, et al.
U.S. Appl. No. 12/901,405, filed Oct. 8, 2010, Tong, et al.
U.S. Appl. No. 11/247,563, filed Oct. 10, 2005, Keller, et al.
U.S. Appl. No. 12/074,762, filed Mar. 5, 2008, Jacobson, et al.
U.S. Appl. No. 13/804,309, filed Mar. 14, 2013, Wilcox, et al.

* cited by examiner

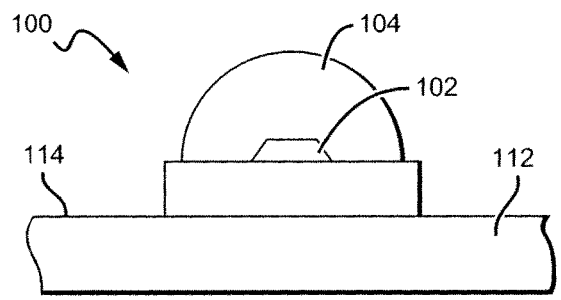
FIG. 1A
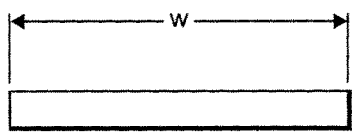
FIG. 1B
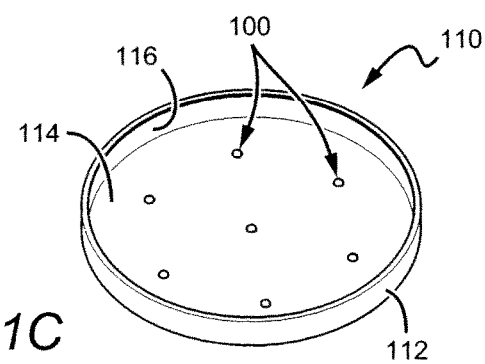
FIG. 1C
FIG. 1D
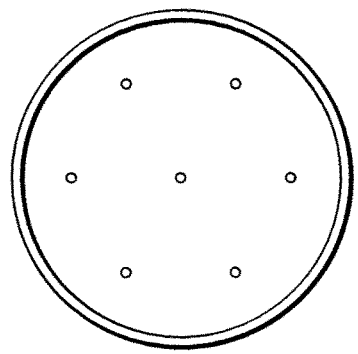
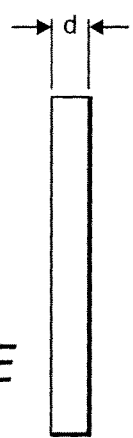
FIG. 1E

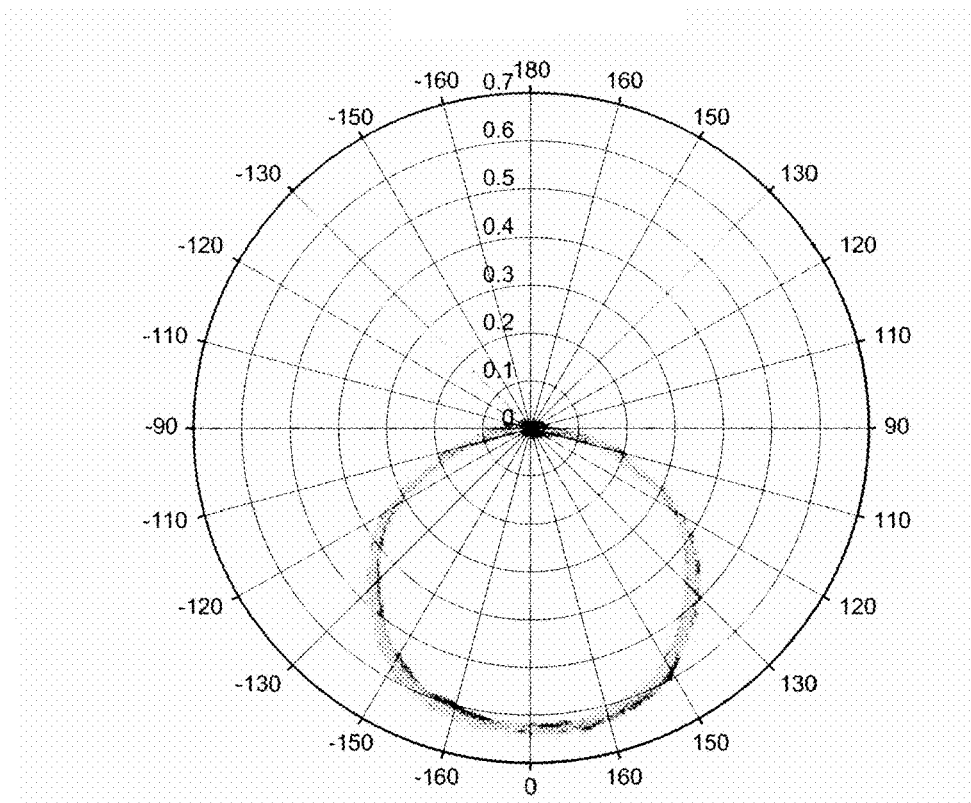
FIG. 1G
FIG. 1H
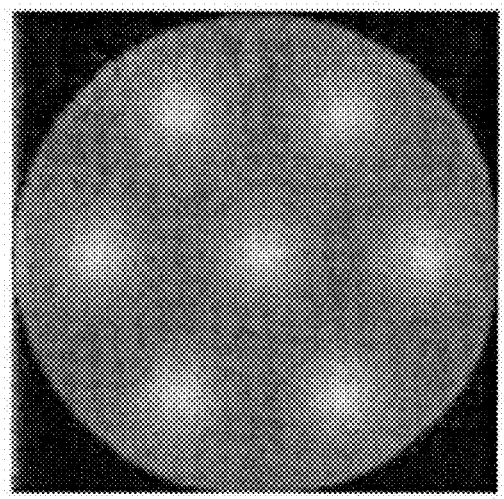

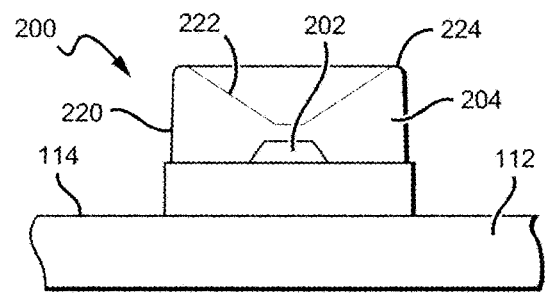
FIG. 2A
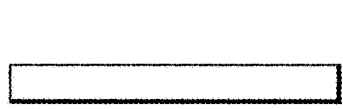
FIG. 2B
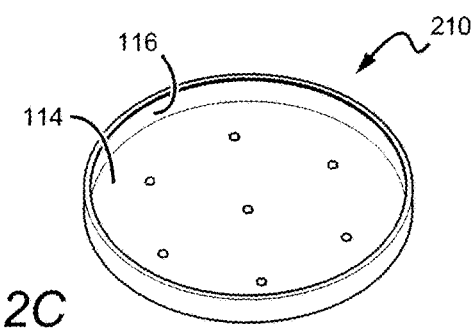
FIG. 2C
FIG. 2D
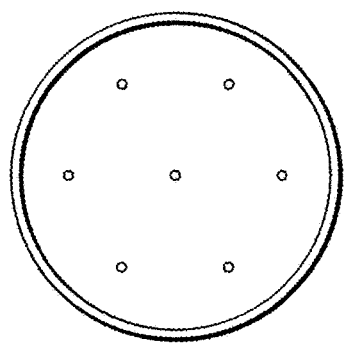
FIG. 2E

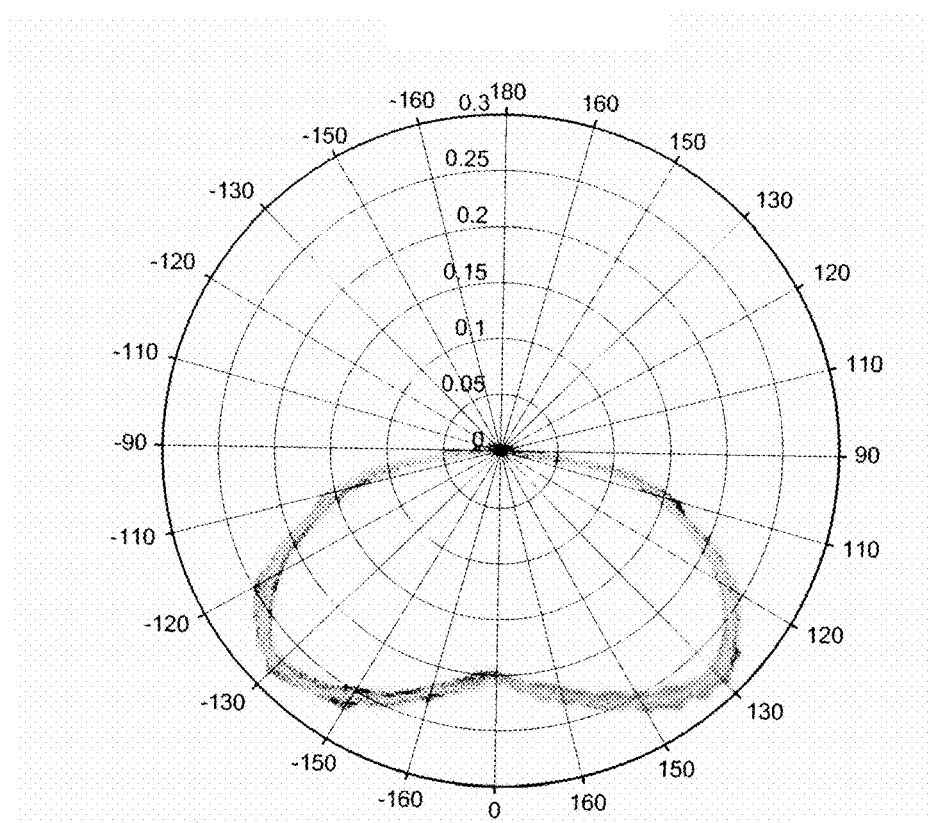
FIG. 2G
FIG. 2H
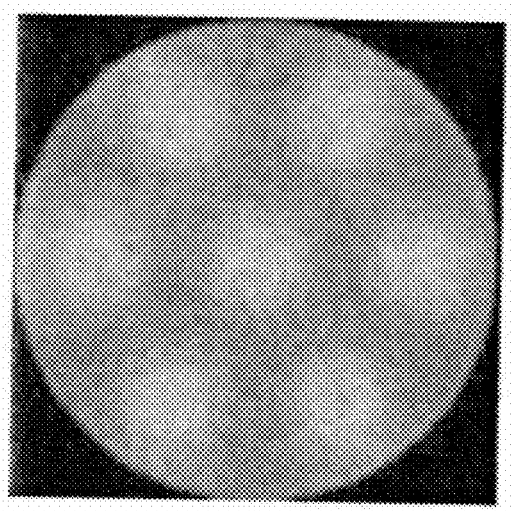

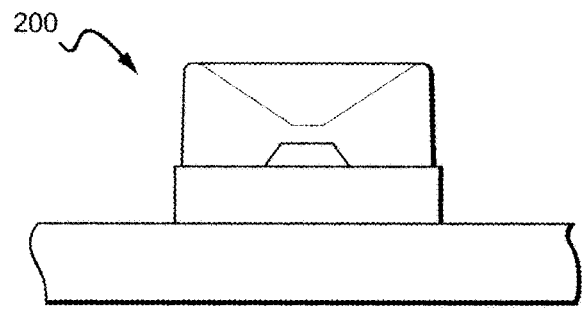
FIG. 3A
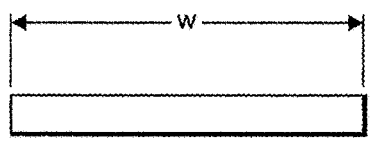
FIG. 3B
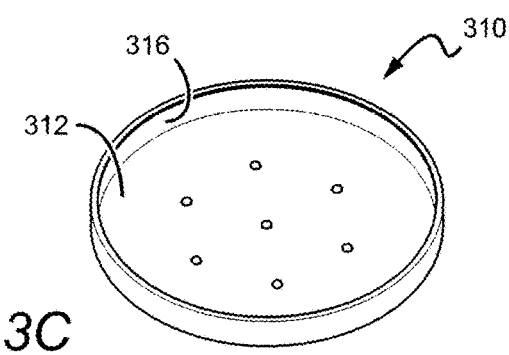
FIG. 3C
FIG. 3D
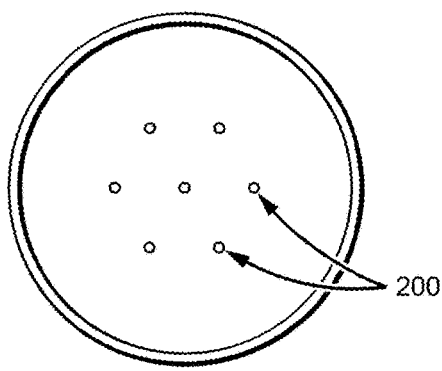
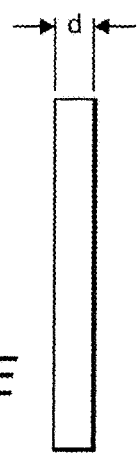
FIG. 3E

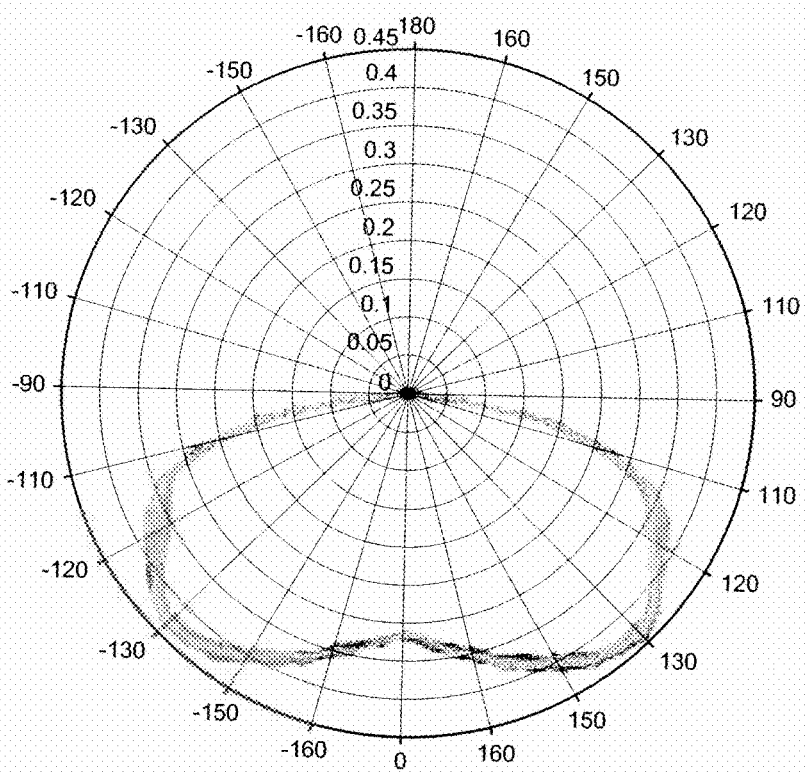
FIG. 3G
FIG. 3H
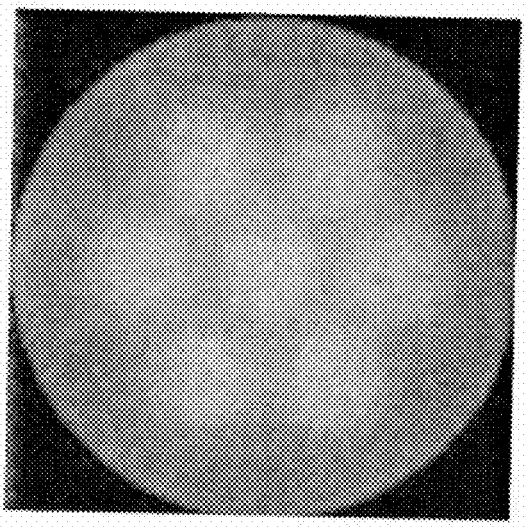

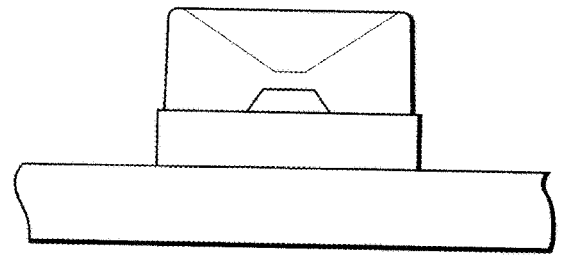
FIG. 4A
FIG. 4B
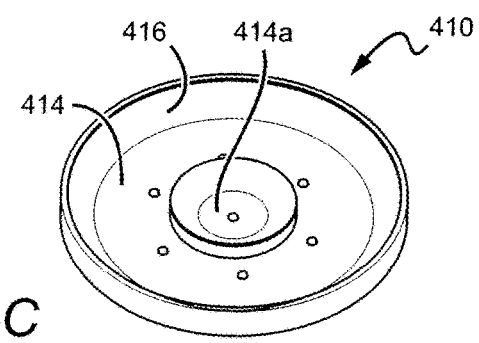
FIG. 4C
FIG. 4D
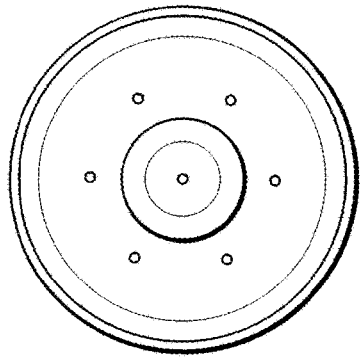
FIG. 4E

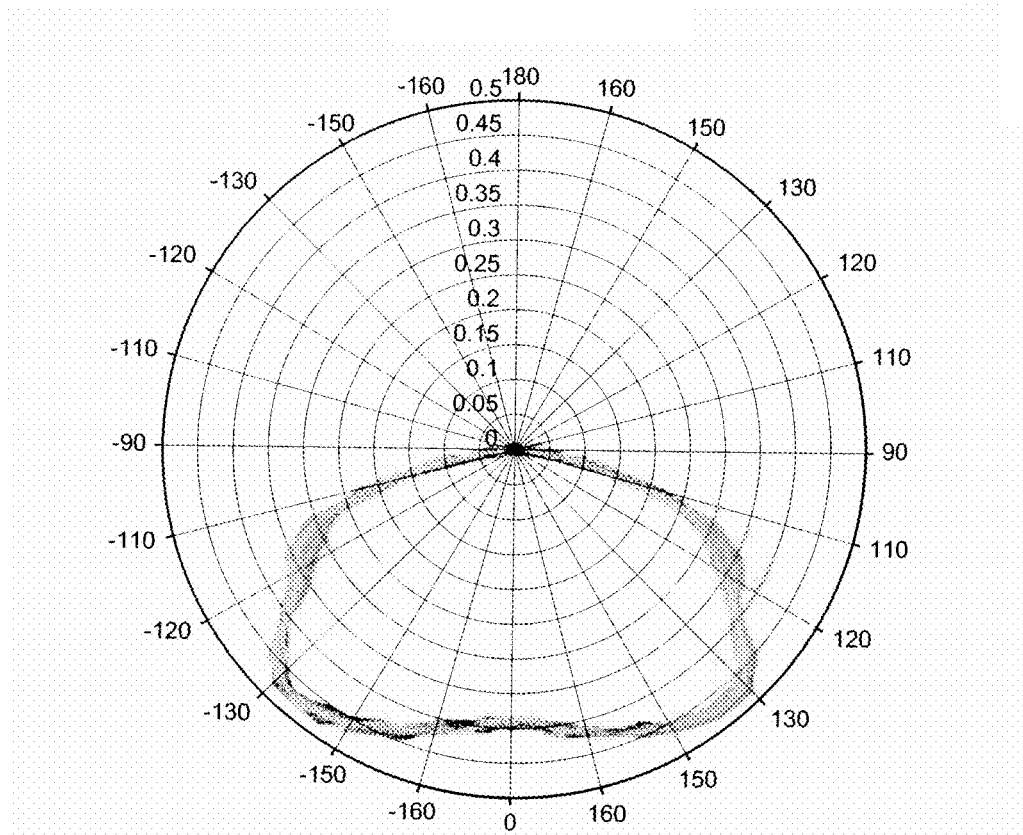
FIG. 4G
FIG. 4H
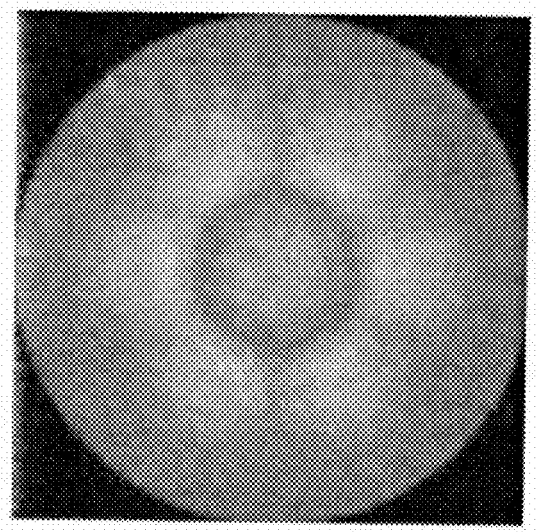

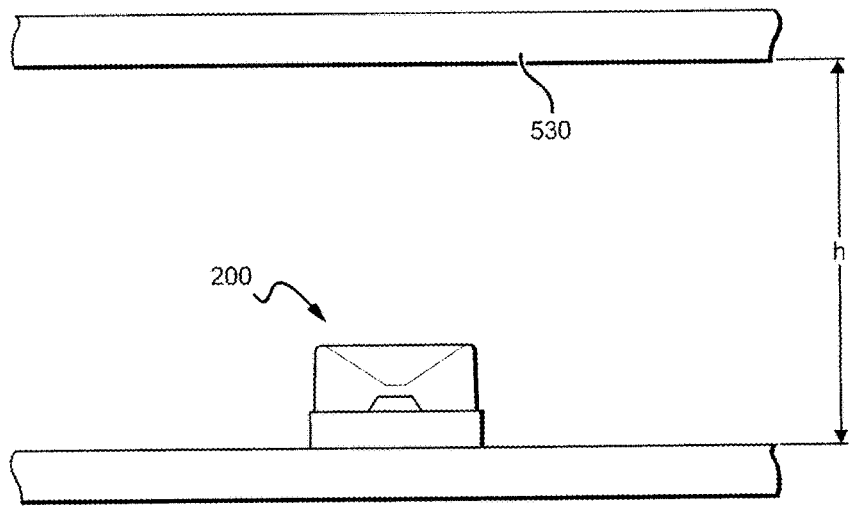
FIG. 5A
FIG. 5B
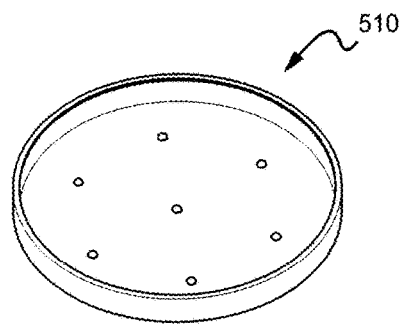
FIG. 5C
FIG. 5D
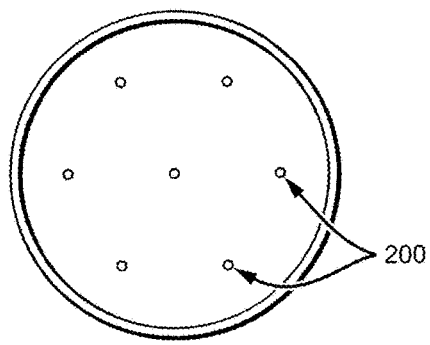
FIG. 5E

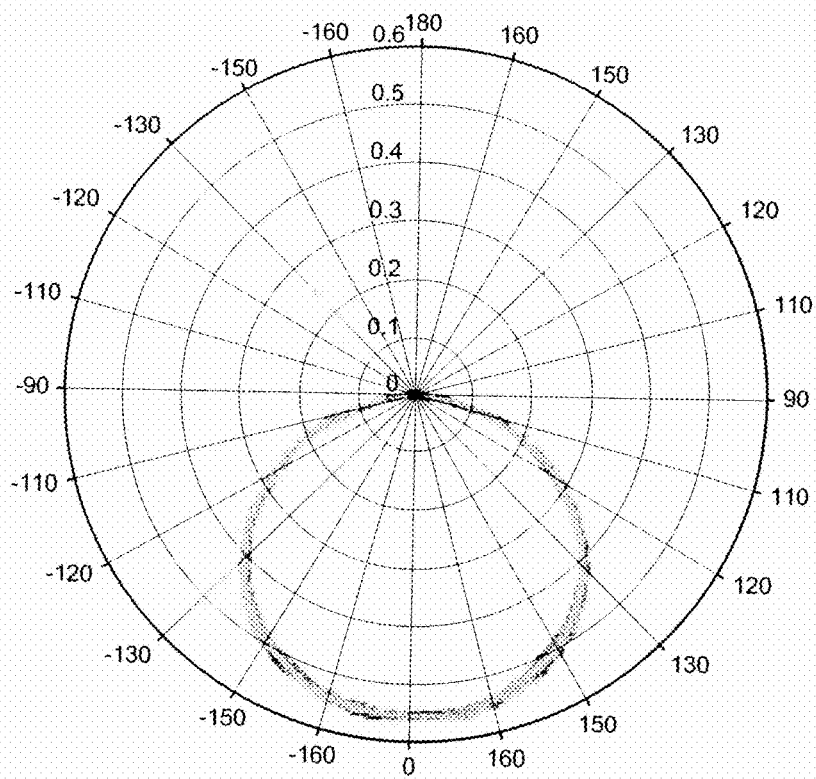
FIG. 5G
FIG. 5H
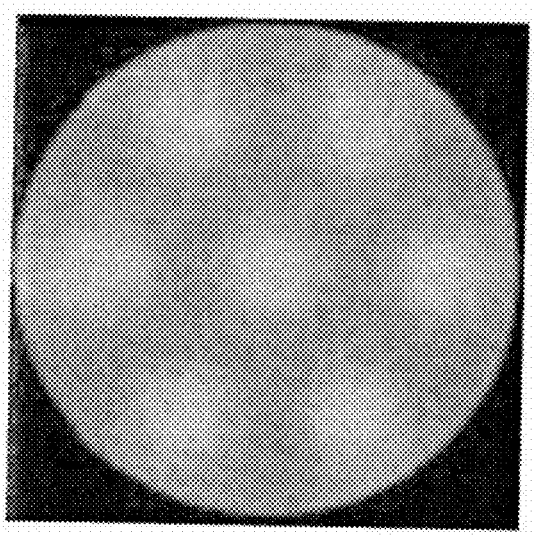

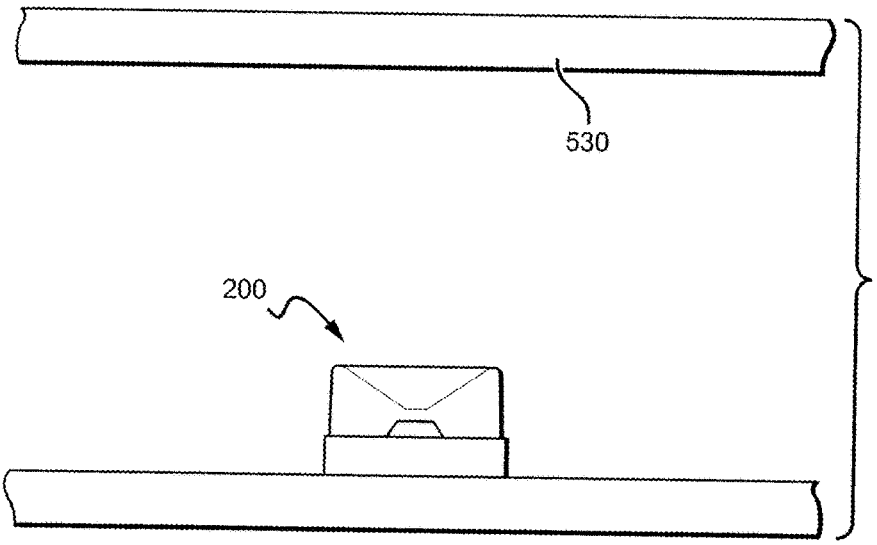
FIG. 6A
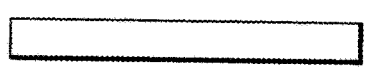
FIG. 6B
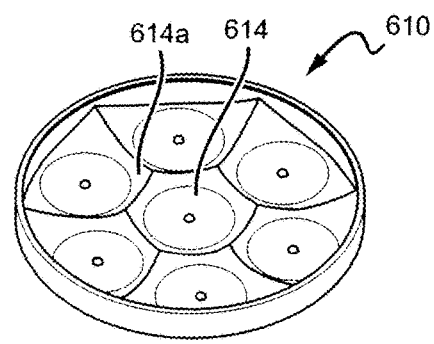
FIG. 6C
FIG. 6D
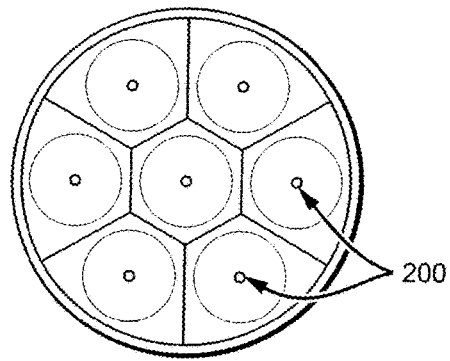
FIG. 6E

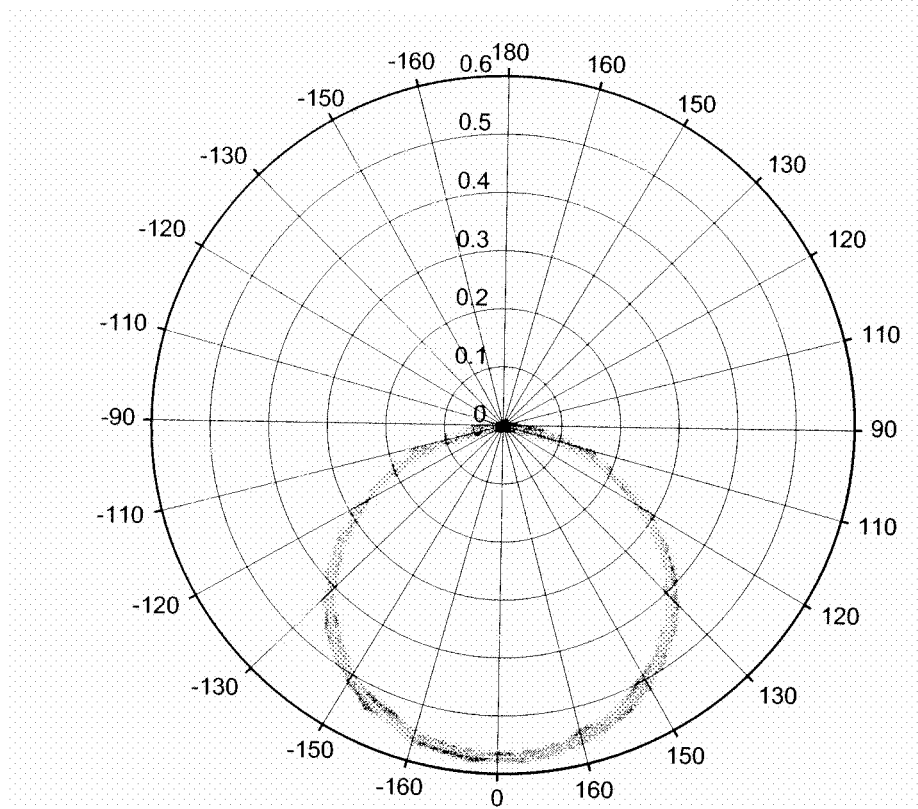
FIG. 6G
FIG. 6H
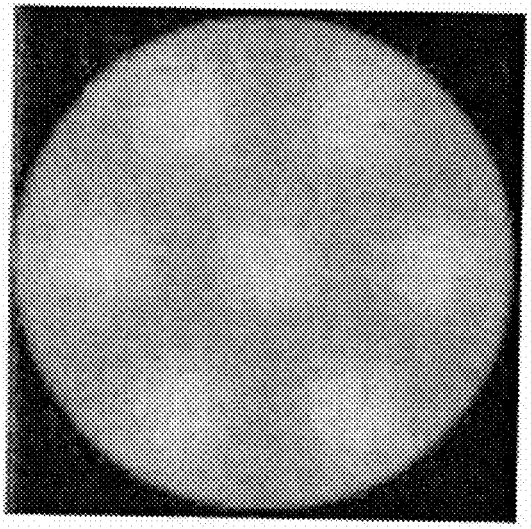

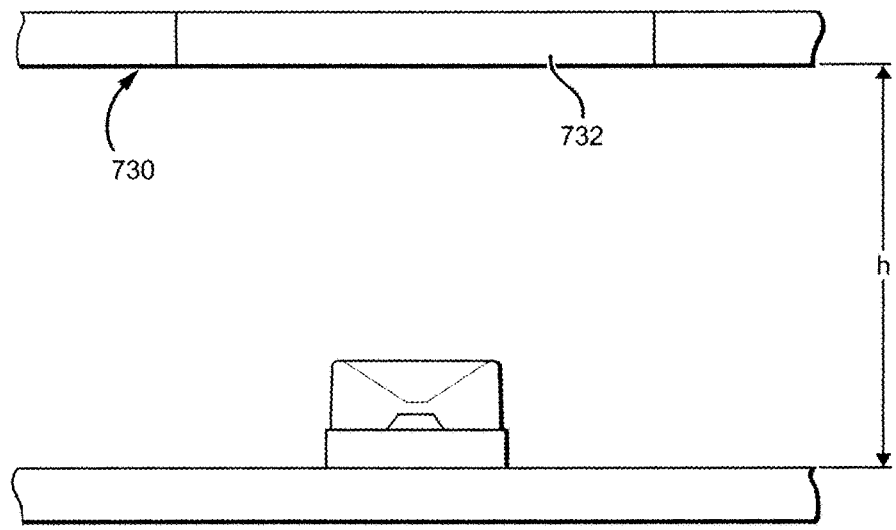
FIG. 7A
FIG. 7B
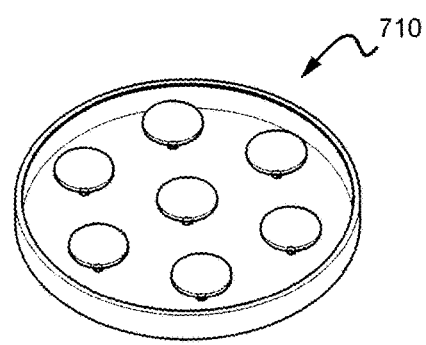
FIG. 7C
FIG. 7D
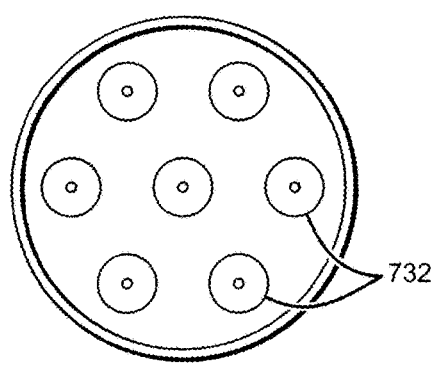
FIG. 7E

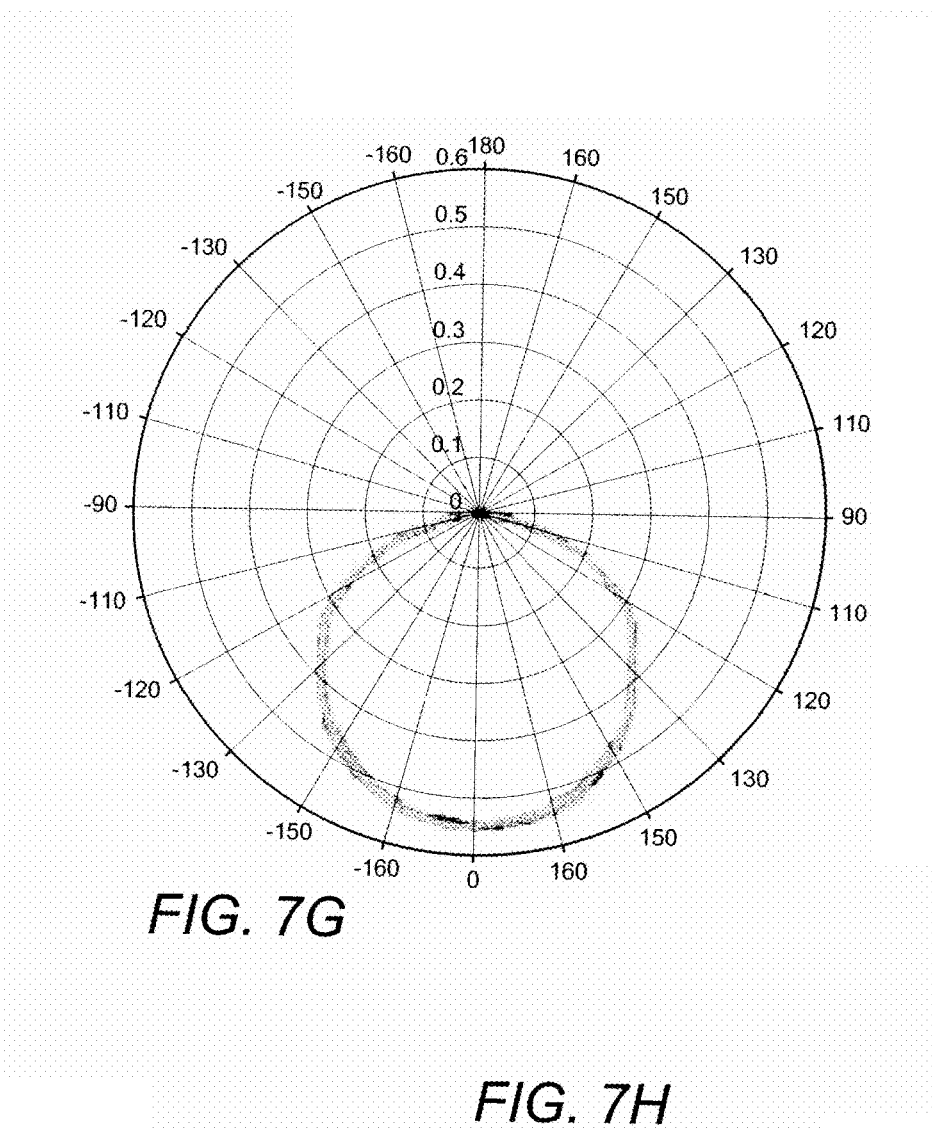
FIG. 7G
FIG. 7H
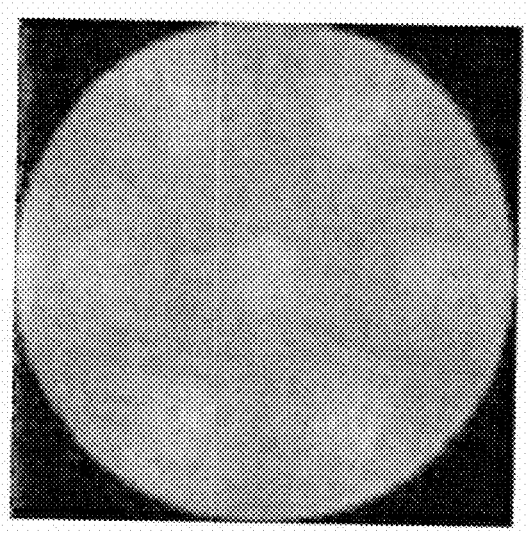

FIG. 8A
FIG. 8B
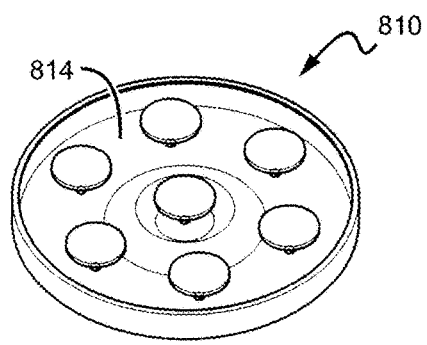
FIG. 8C
FIG. 8D
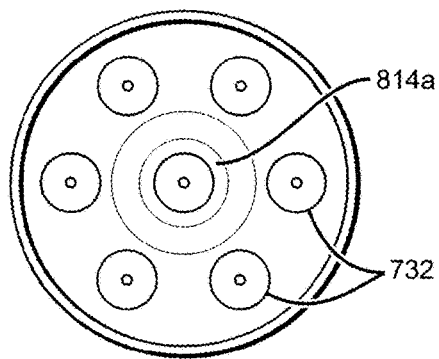
FIG. 8E

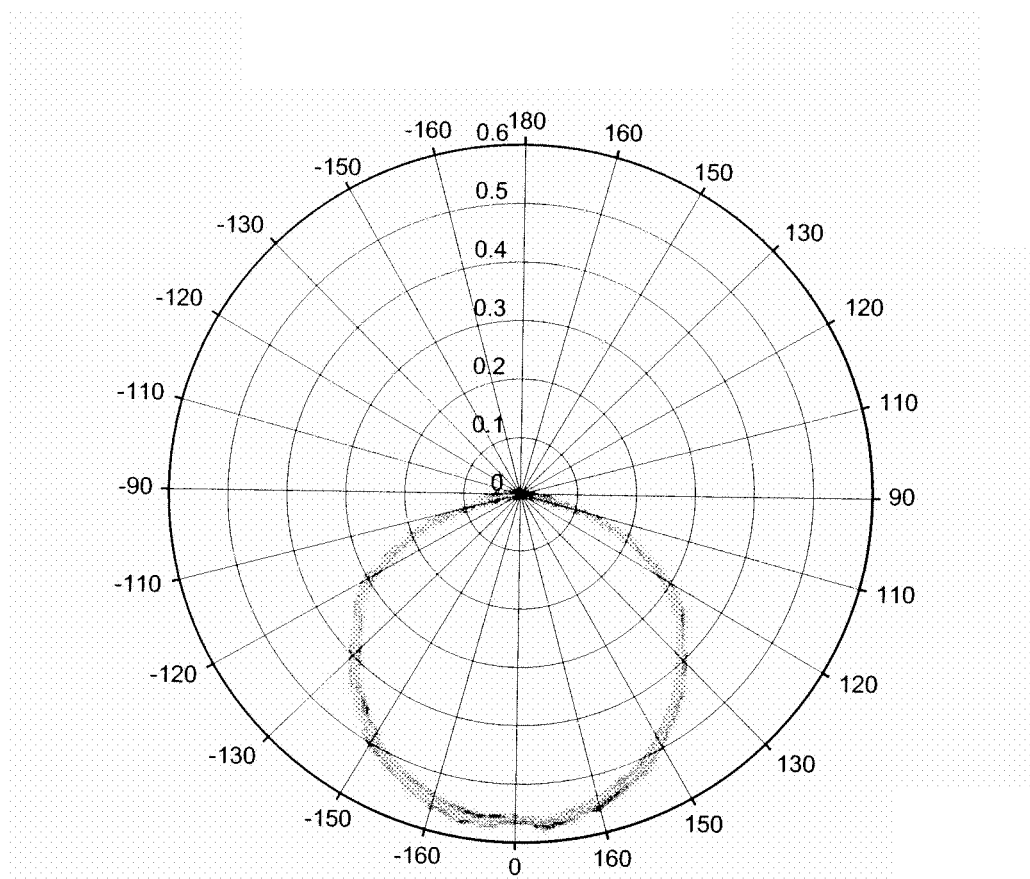
FIG. 8G
FIG. 8H
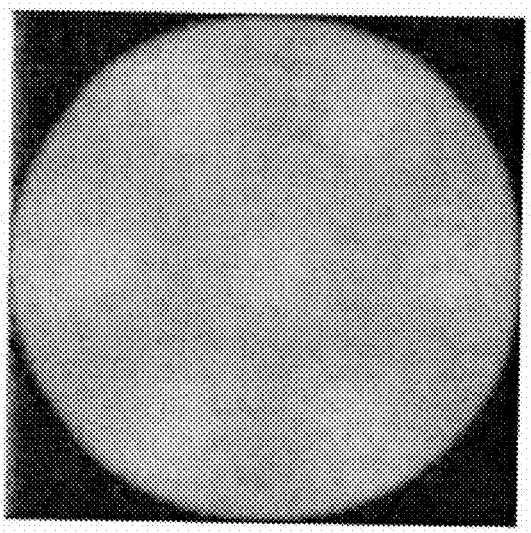

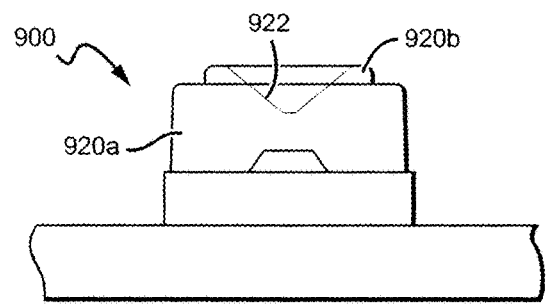
FIG. 9A
FIG. 9B
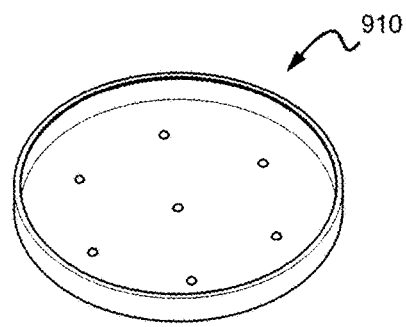
FIG. 9C
FIG. 9D
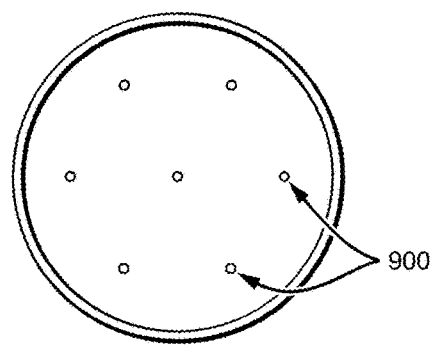
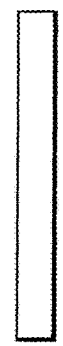
FIG. 9E

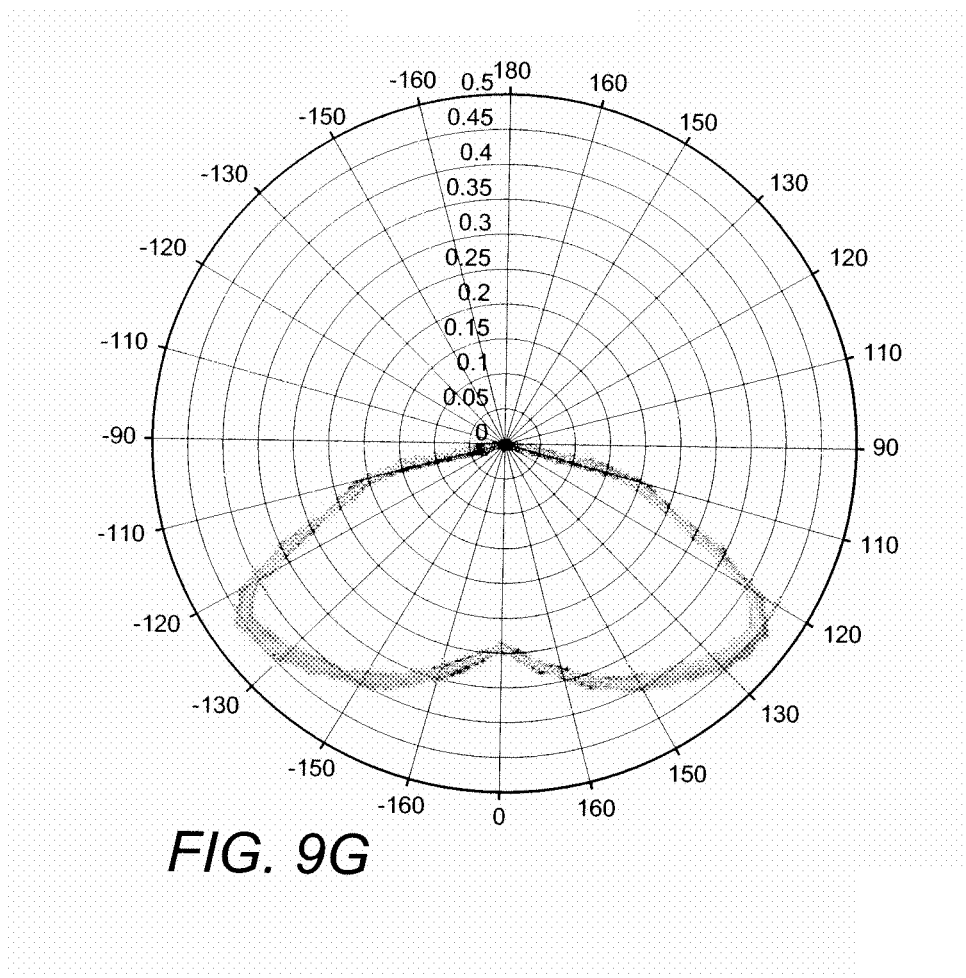
FIG. 9G
FIG. 9H
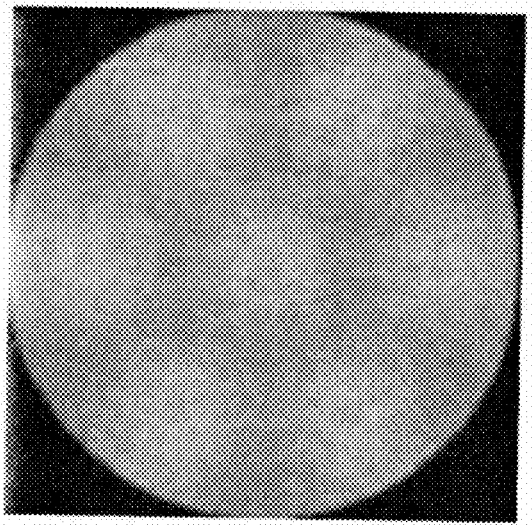

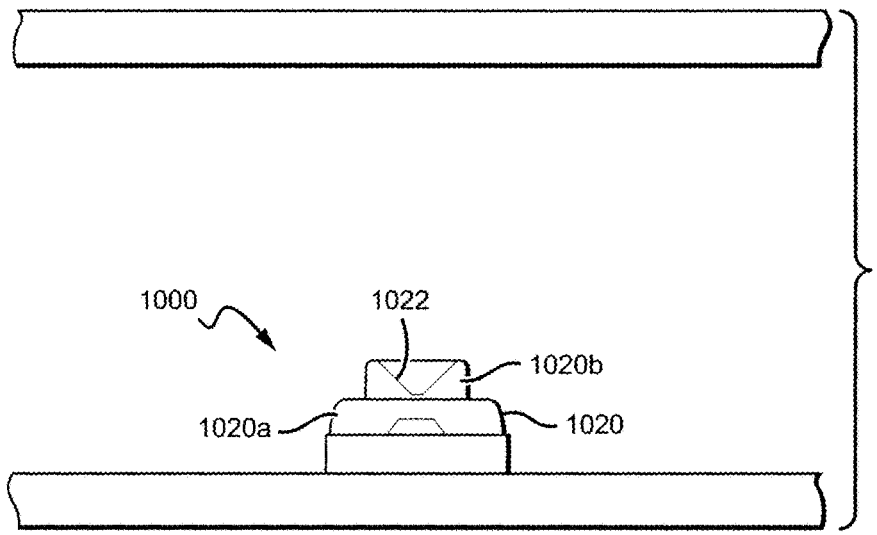
FIG. 10A
FIG. 10B
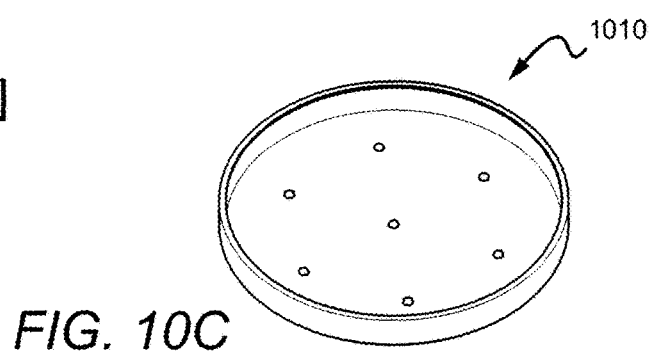
FIG. 10C
FIG. 10D
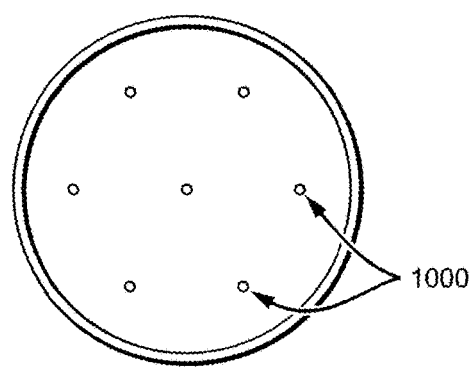
FIG. 10E

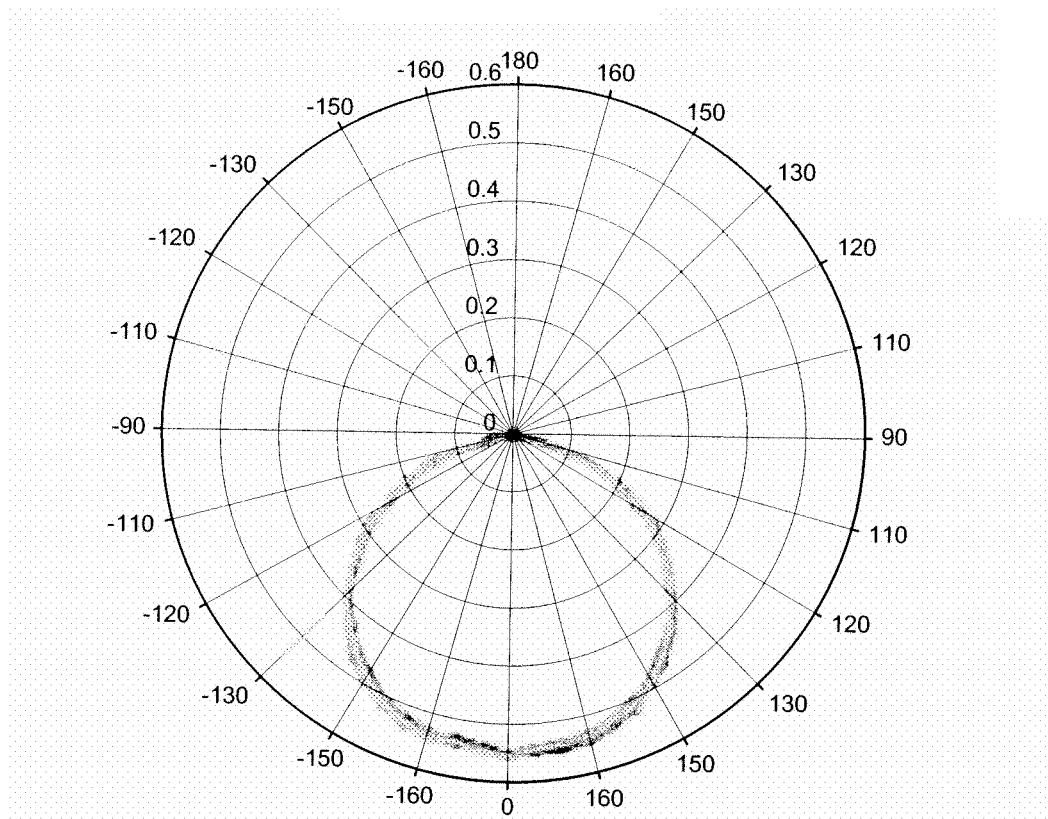
FIG. 10G
FIG. 10H
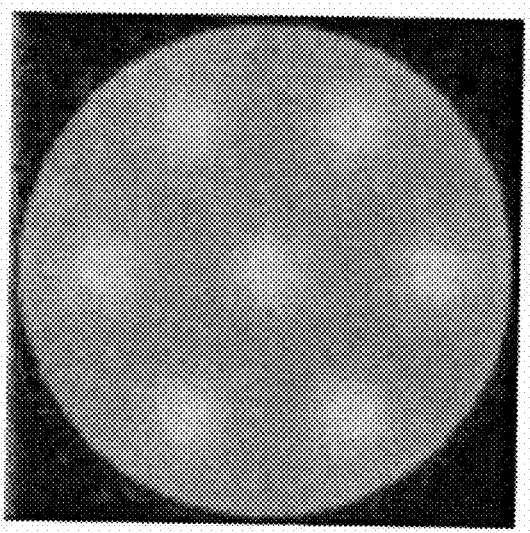

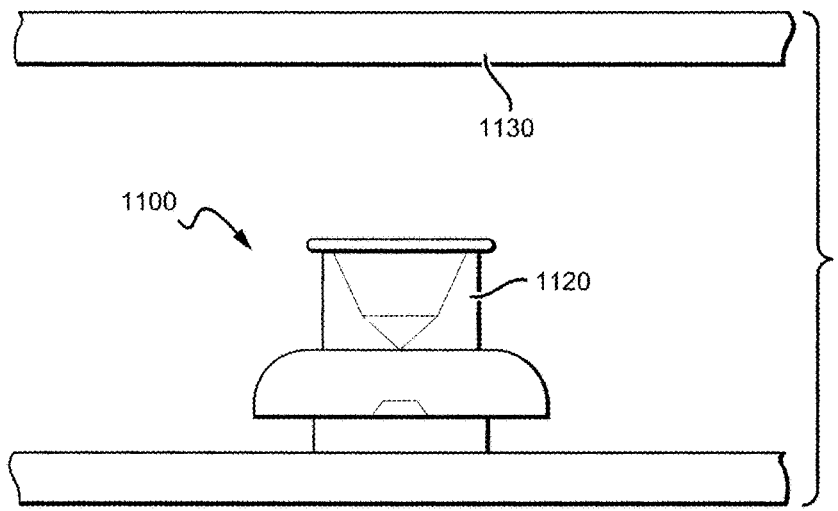
FIG. 11A
FIG. 11B
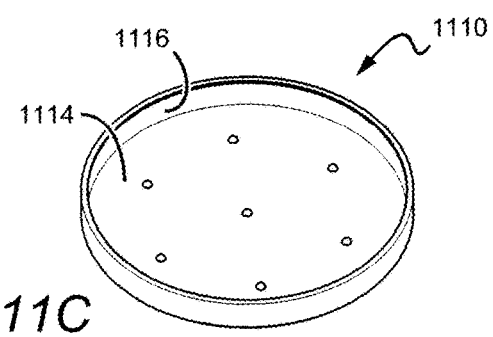
FIG. 11C
FIG. 11D
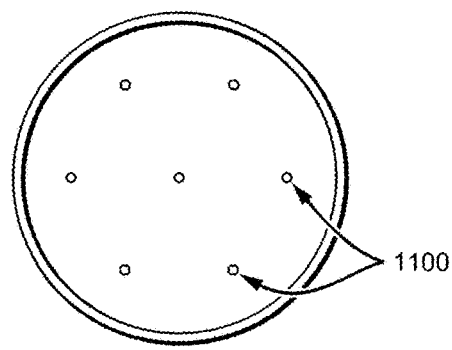
FIG. 11E

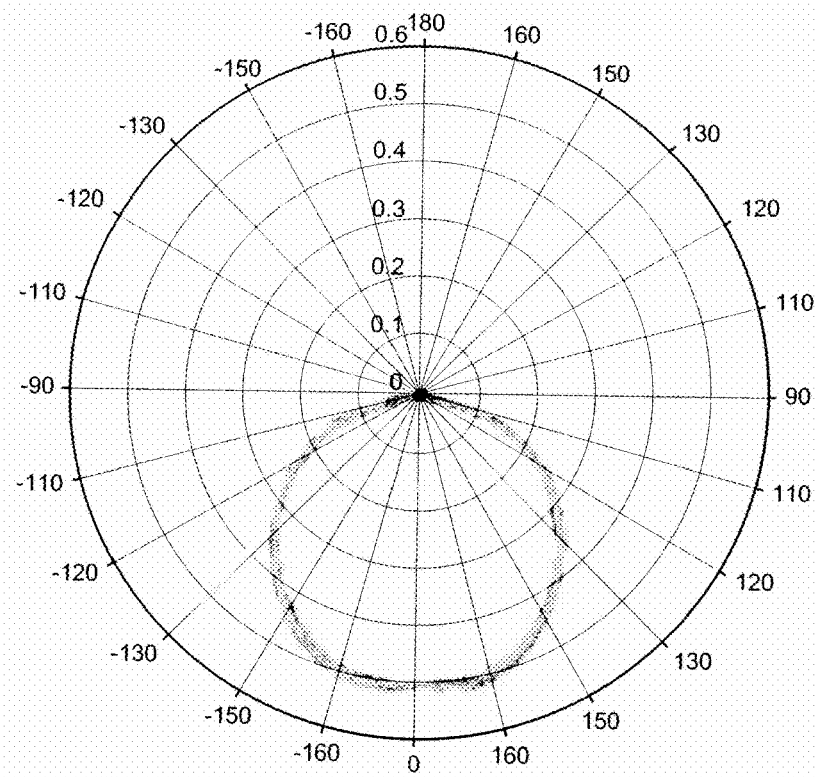
FIG. 11G
FIG. 11H
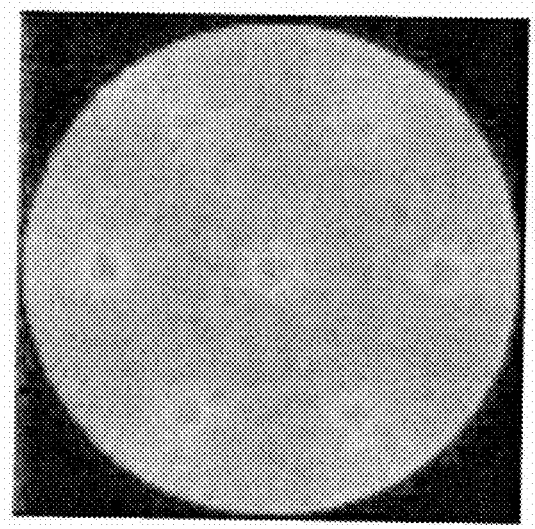

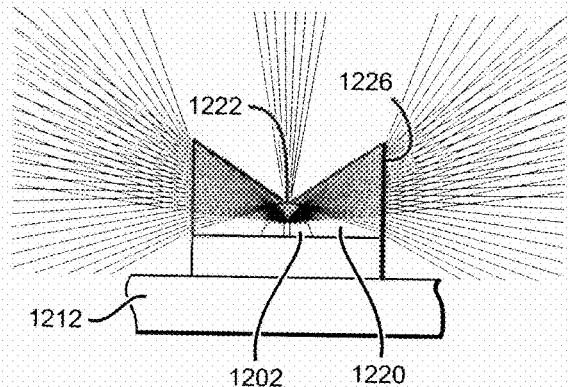
FIG. 12
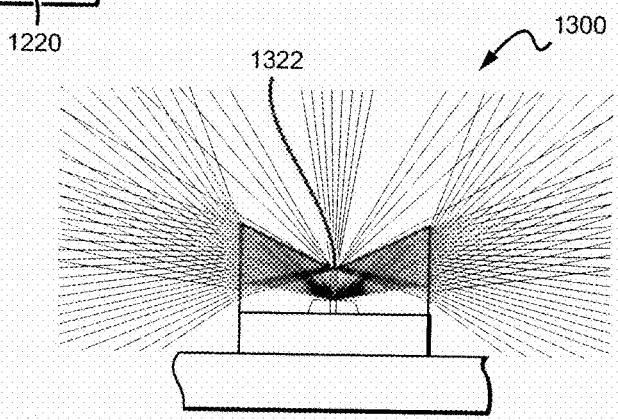
FIG. 13
FIG. 14A
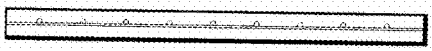
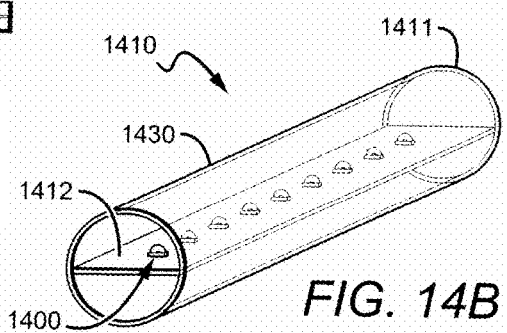
FIG. 14B
FIG. 14D
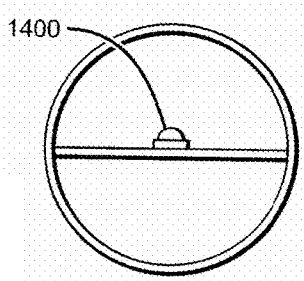
FIG. 14C
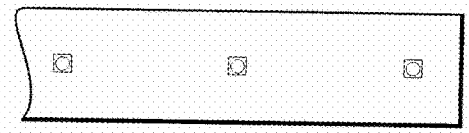

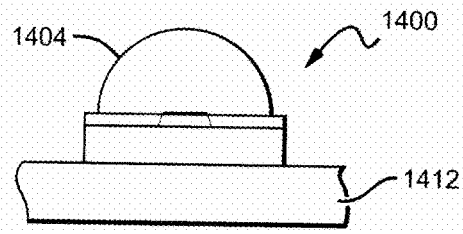
FIG. 15A
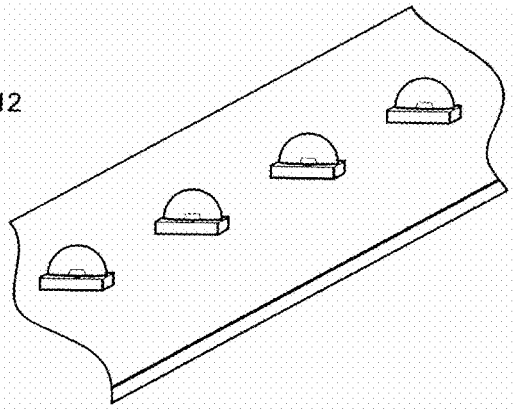
FIG. 15B
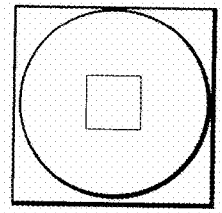
FIG. 15C
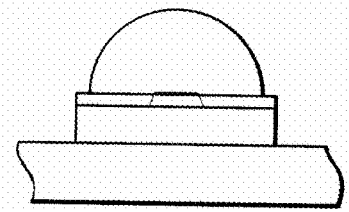
FIG. 15D
FIG. 15F
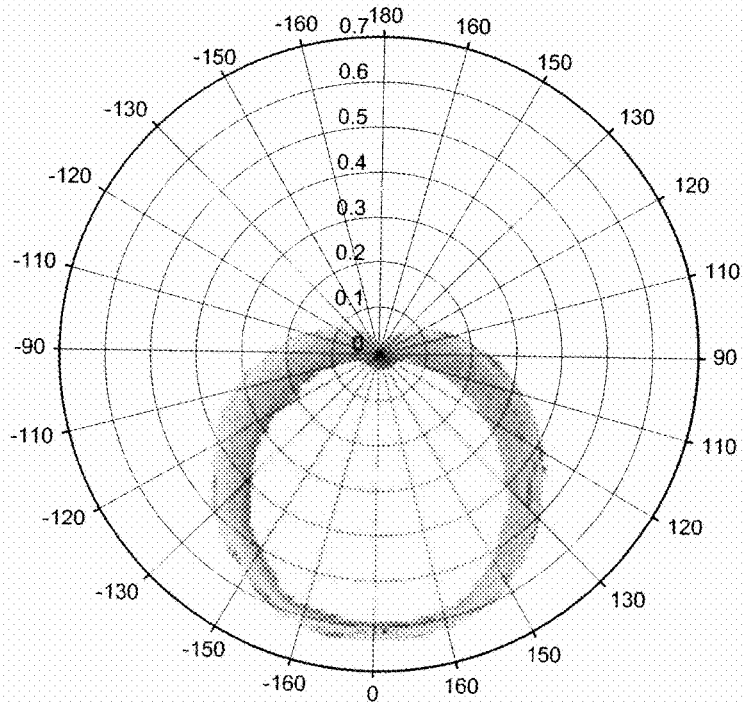

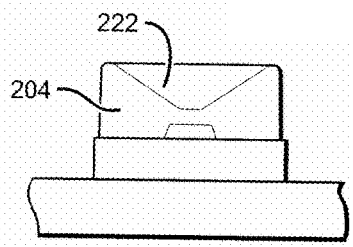
FIG. 16A
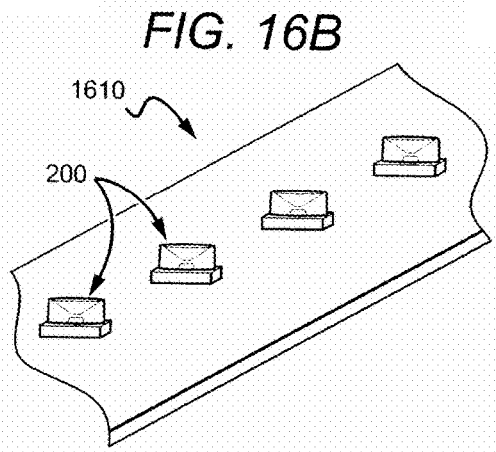
FIG. 16B
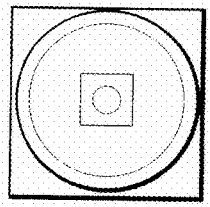
FIG. 16C
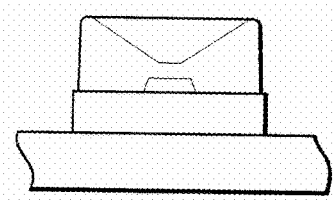
FIG. 16D
FIG. 16F
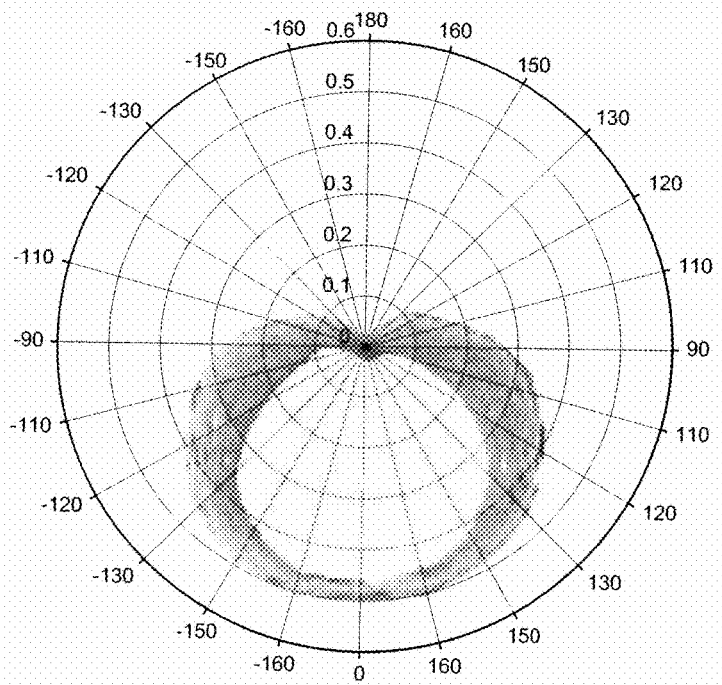

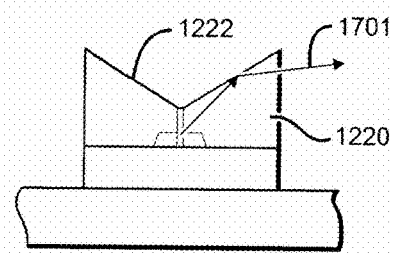
FIG. 17A
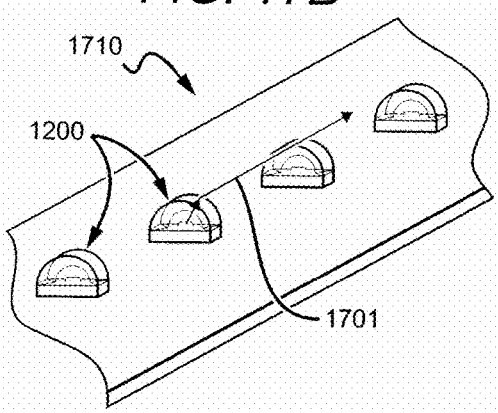
FIG. 17B
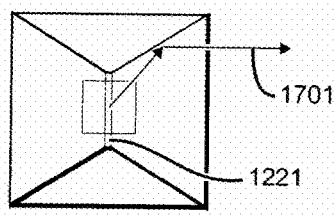
FIG. 17C
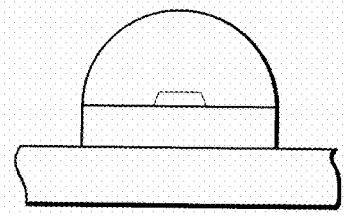
FIG. 17D
FIG. 17F
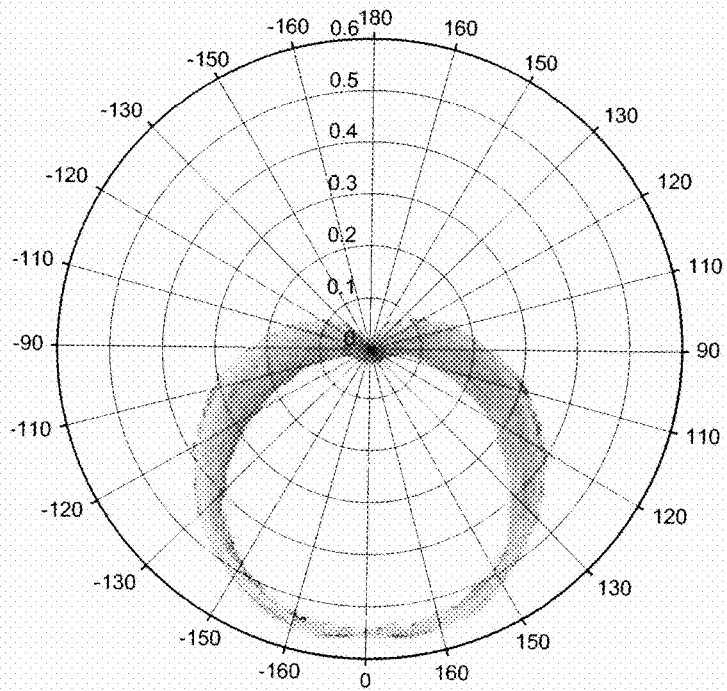

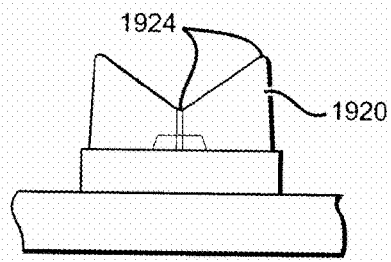
FIG. 19A
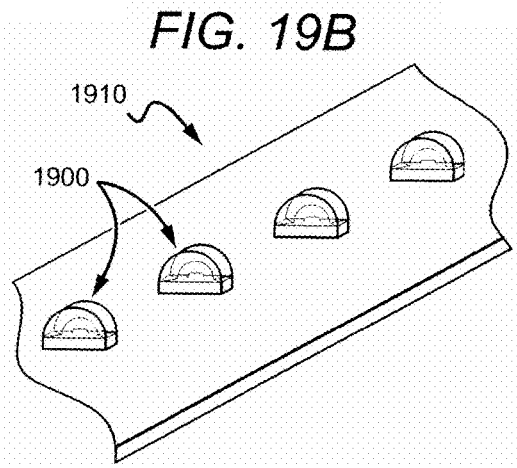
FIG. 19B
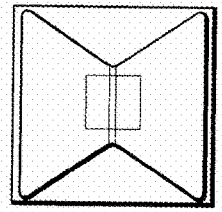
FIG. 19C
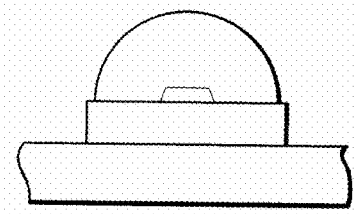
FIG. 19D
FIG. 19F
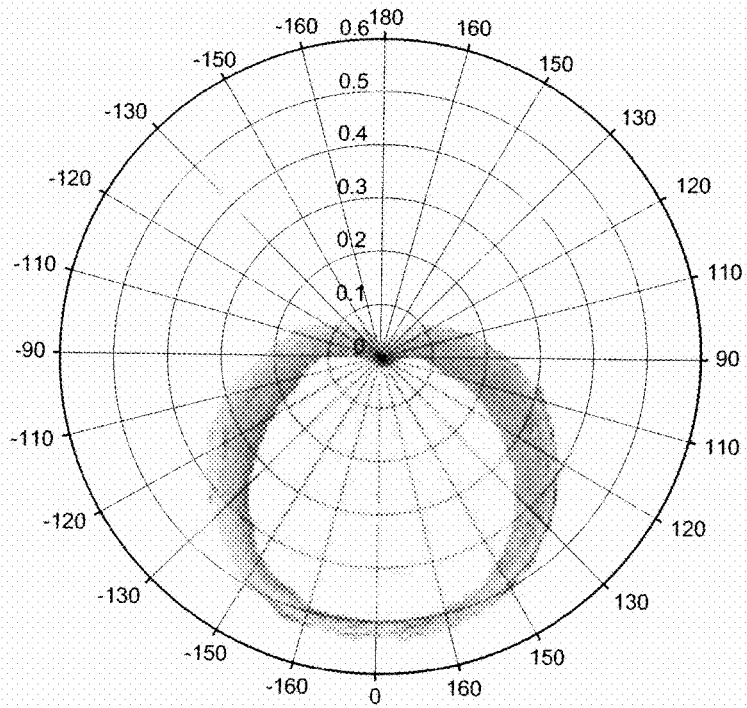

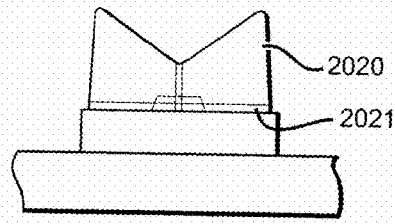
FIG. 20A
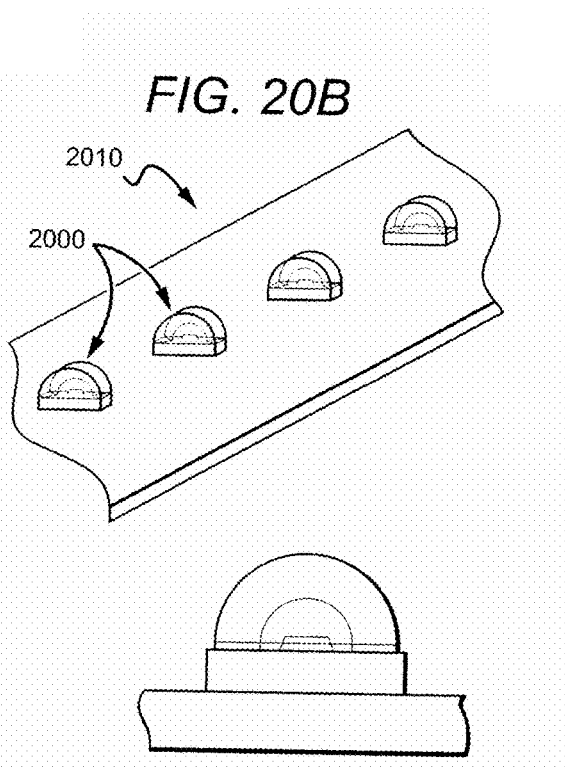
FIG. 20B
FIG. 20C
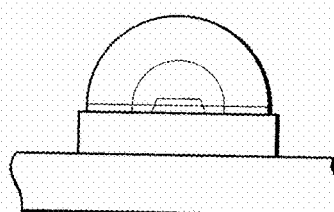
FIG. 20D
FIG. 20F
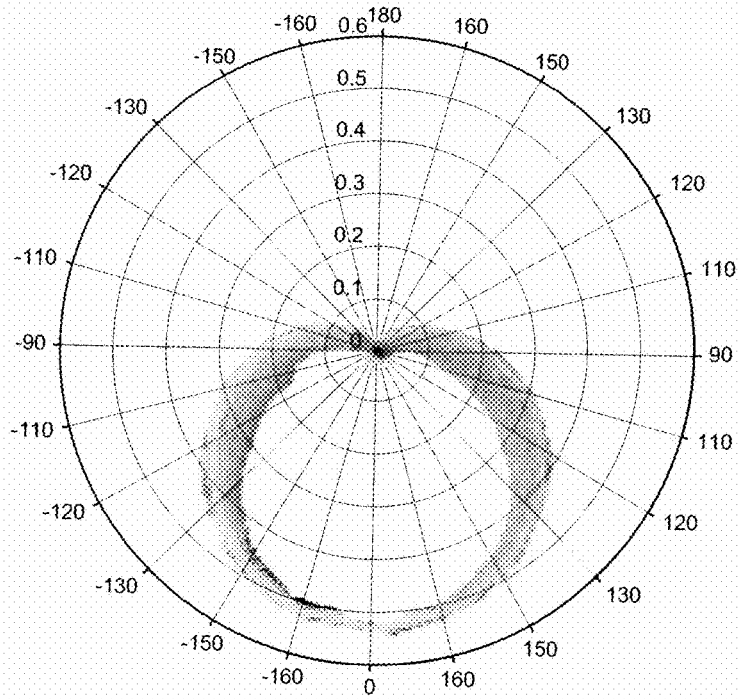

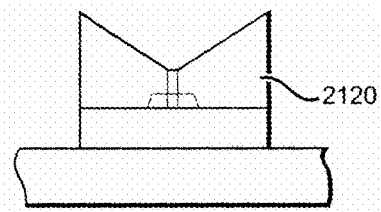
FIG. 21A
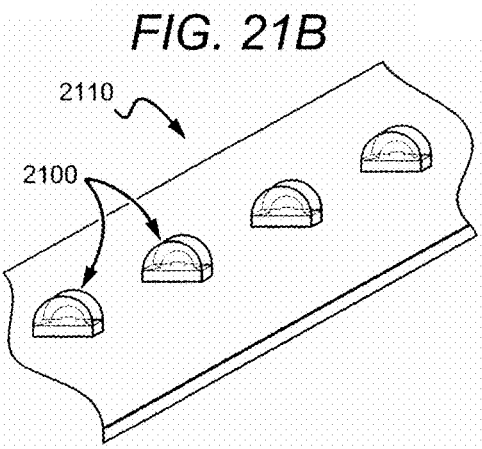
FIG. 21B
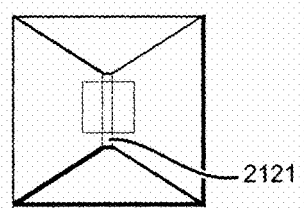
FIG. 21C
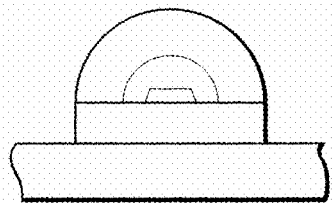
FIG. 21D
FIG. 21F
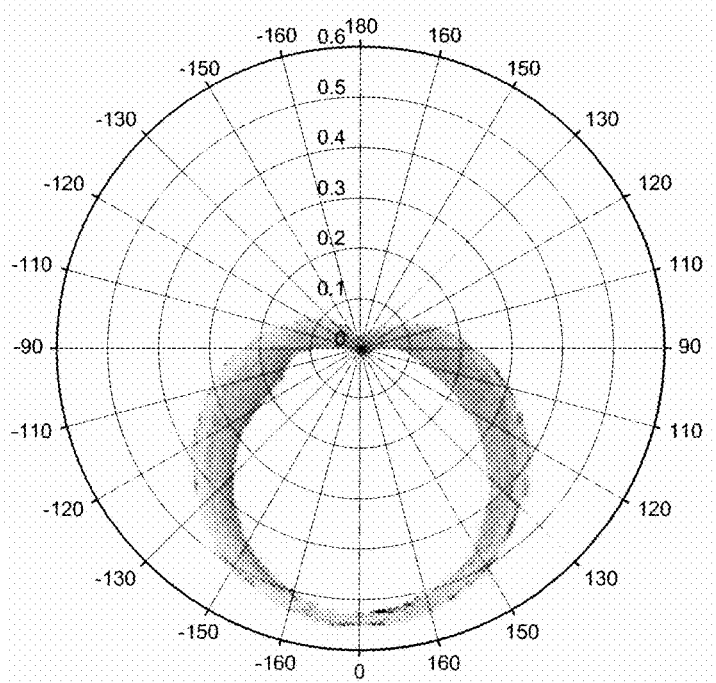

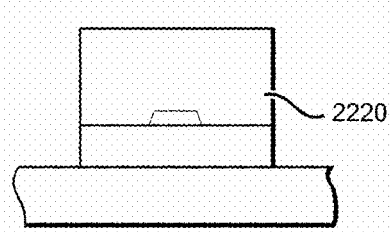
FIG. 22A
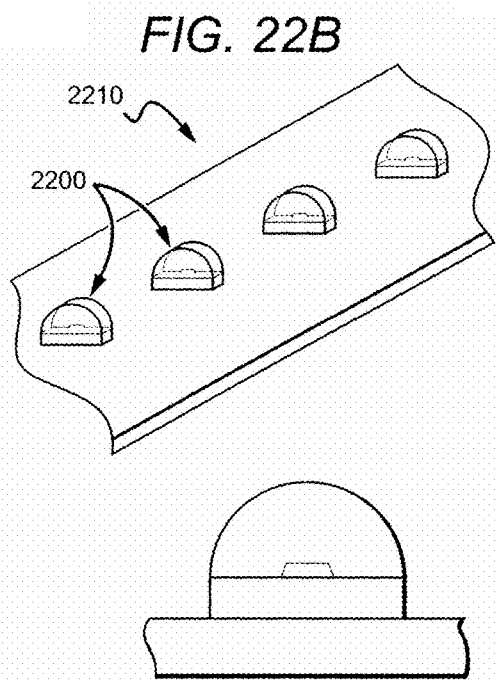
FIG. 22B
FIG. 22C
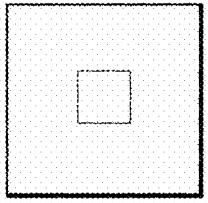
FIG. 22D
FIG. 22F
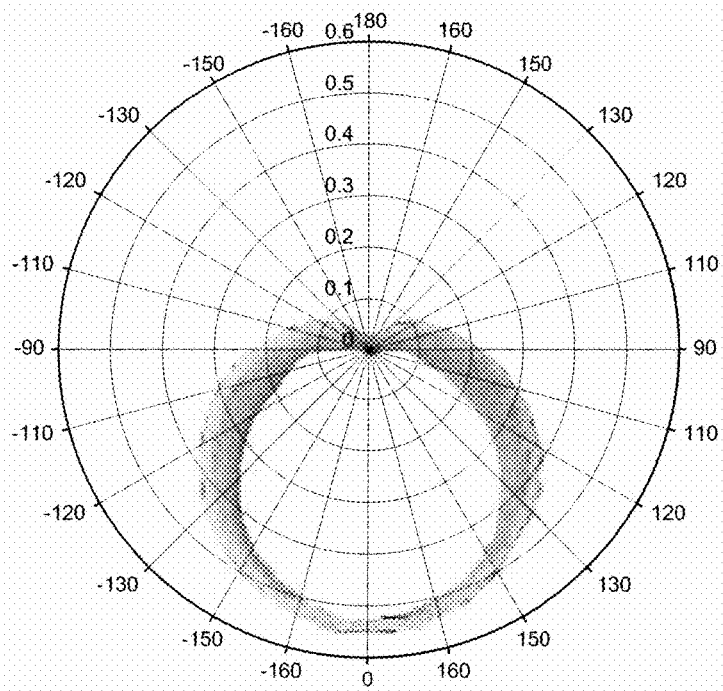

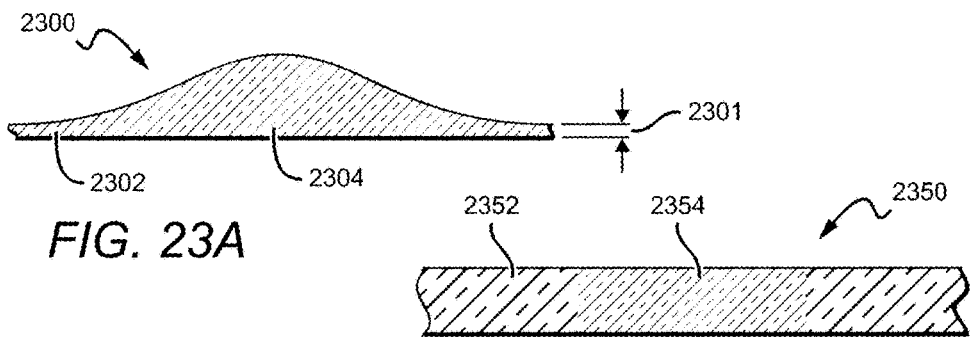
FIG. 23A
FIG. 23B
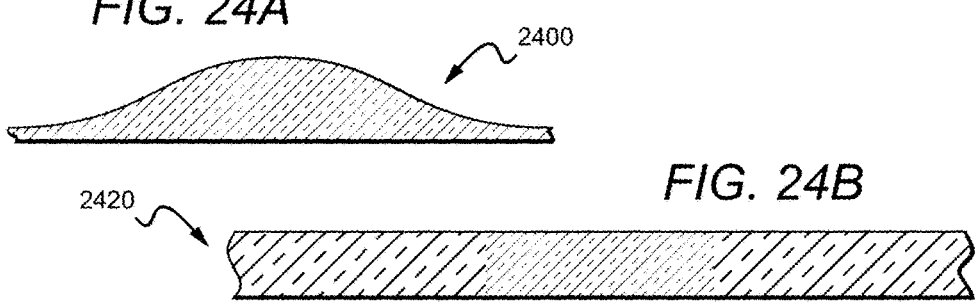
FIG. 24A
FIG. 24B
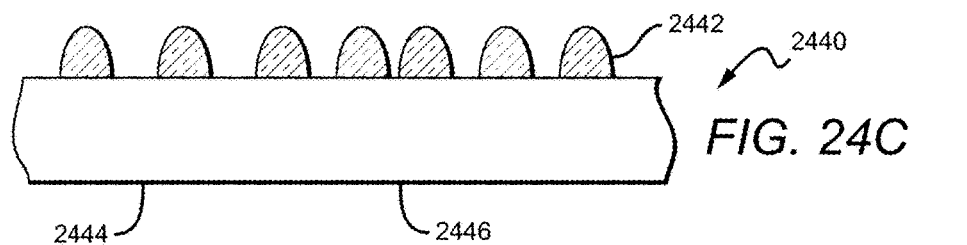
FIG. 24C
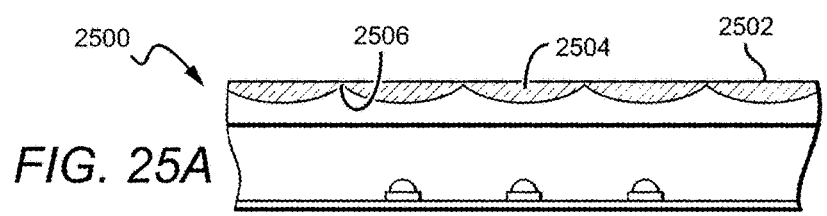
FIG. 25A
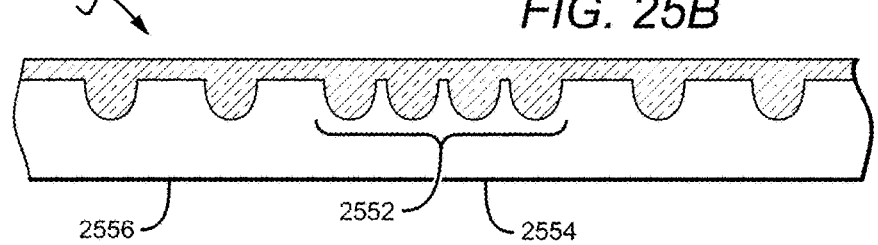
FIG. 25B

US 10,288,261 B2

LOW PROFILE LIGHTING MODULE

CROSS REFERENCE TO RELATED APPLICATIONS

This application is a divisional of U.S. patent application Ser. No. 13/842,307, filed on Mar. 15, 2013 now U.S. Pat. No. 9,054,019, which claims the benefit of U.S. Provisional Application Ser. No. 61/619,370, filed on Apr. 2, 2012. All applications referred to in this paragraph are hereby incorporated by reference herein in their entirety.

FIELD OF THE INVENTION

Embodiments of the invention relate to efficient lighting modules that have a reduced cross-sectional profile (i.e., reduced depth) and that are well-suited for used with solid state light sources.

DESCRIPTION OF THE RELATED ART

Light emitting diodes (LEDs) are solid state devices that convert electric energy to light and generally comprise one or more active regions of semiconductor material interposed between oppositely doped semiconductor layers. When a bias is applied across the doped layers, holes and electrons are injected into the active region where they recombine to generate light. Light is produced in the active region and emitted from surfaces of the LED.

LEDs have certain characteristics that make them desirable for many lighting applications that were previously the realm of incandescent or fluorescent lights. Incandescent lights are very energy-inefficient light sources with approximately ninety percent of the electricity they consume being released as heat rather than light. Fluorescent light bulbs are more energy efficient than incandescent light bulbs by a factor of about 10, but are still relatively inefficient. LEDs by contrast, can emit the same luminous flux as incandescent and fluorescent lights using a fraction of the energy.

In addition, LEDs can have a significantly longer operational lifetime. Incandescent light bulbs have relatively short lifetimes, with some having a lifetime in the range of about 750-1000 hours. Fluorescent bulbs can also have lifetimes longer than incandescent bulbs such as in the range of approximately 10,000-20,000 hours, but provide less desirable color reproduction. In comparison, LEDs can have lifetimes between 50,000 and 70,000 hours. The increased efficiency and extended lifetime of LEDs is attractive to many lighting suppliers and has resulted in their LED lights being used in place of conventional lighting in many different applications. It is predicted that further improvements will result in their general acceptance in more and more lighting applications. An increase in the adoption of LEDs in place of incandescent or fluorescent lighting would result in increased lighting efficiency and significant energy saving.

Other LED components or lamps have been developed that comprise an array of multiple LED packages mounted to a (PCB), substrate or submount. The array of LED packages can comprise groups of LED packages emitting different colors, and specular reflector systems to reflect light emitted by the LED chips. Some of these LED components are arranged to produce a white light combination of the light emitted by the different LED chips.

Many LED modules comprising multiple LED packages can produce "hotspots," or areas high luminous emittance (lux, or lumens per square meter) corresponding to the placement of the LED packages within the module which can be displeasing to a viewer. One goal of many LED module applications is to reduce these hotspots and produce a module with an emission surface having as uniform a luminous emittance as possible (and thus having a low max/min luminous emittance ratio). One variable that has a substantial effect upon uniformity is the ratio of the distance between LED packages to the distance from the mount surface to the bottom of the emission surface, such as a diffuser. If this ratio is less than 1:1, a fairly uniform emission can be achieved so long as the packages are mounted on a sufficiently large area. However, such a ratio often requires a large number of LEDs within a module, and thus can be cost inefficient.

In order to generate a desired output color, it is sometimes necessary to mix colors of light which are more easily produced using common semiconductor systems. Of particular interest is the generation of white light for use in everyday lighting applications. Conventional LEDs cannot generate white light from their active layers; it must be produced from a combination of other colors. For example, blue emitting LEDs have been used to generate white light by surrounding the blue LED with a yellow phosphor, polymer or dye, with a typical phosphor being cerium-doped yttrium aluminum garnet (Ce:YAG). The surrounding phosphor material "downconverts" some of the blue light, changing it to yellow light. Some of the blue light passes through the phosphor without being changed while a substantial portion of the light is downconverted to yellow. The LED emits both blue and yellow light, which combine to yield white light.

Because of the physical arrangement of the various source elements, multicolor sources often cast shadows with color separation and provide an output with poor color uniformity. For example, a source featuring blue and yellow sources may appear to have a blue tint when viewed head on and a yellow tint when viewed from the side. Thus, one challenge associated with multicolor light sources is good spatial color mixing over the entire range of viewing angles. One known approach to the problem of color mixing is to use a diffuser to scatter light from the various sources.

Another known method to improve color mixing is to reflect or bounce the light off of several surfaces before it is emitted from the lamp. This has the effect of disassociating the emitted light from its initial emission angle. Uniformity typically improves with an increasing number of bounces, but each bounce has an associated optical loss. Some applications use intermediate diffusion mechanisms (e.g., formed diffusers and textured lenses) to mix the various colors of light. Many of these devices are lossy and, thus, improve the color uniformity at the expense of the optical efficiency of the device.

Some direct view lamps emit both uncontrolled and controlled light. Uncontrolled light is light that is directly emitted from the lamp without any reflective bounces to guide it. According to probability, a portion of the uncontrolled light is emitted in a direction that is useful for a given application. Controlled light is directed in a certain direction with reflective or refractive surfaces. The mixture of uncontrolled and controlled light defines the output beam profile.

A retroreflective lamp arrangement, such as a vehicle headlamp, utilizes multiple reflective surfaces to control all of the emitted light. That is, light from the source either bounces off an outer reflector (single bounce) or it bounces off a retroreflector and then off of an outer reflector (double bounce). Either way the light is redirected before emission and, thus, controlled. In a typical headlamp application, the source is an omni-emitter, suspended at the focal point of an outer reflector. A retroreflector is used to reflect the light from the front hemisphere of the source back through the envelope of the source, changing the source to a single hemisphere emitter.

Many current luminaire designs utilize forward-facing LED components with a specular reflector disposed behind the LEDs. One design challenge associated with multi-source luminaires is blending the light from LED sources within the luminaire so that the individual sources are not visible to an observer. Diffusive elements are often used to mix the color spectra from the various sources to achieve a uniform output color profile. To blend the sources and aid in color mixing, heavily diffusive exit windows have been used. However, transmission through such heavily diffusive materials can cause significant optical loss.

SUMMARY OF THE INVENTION

The present invention is generally directed to light emitting devices, such as LED packages and lighting modules incorporating LEDs, which can incorporate primary optics, reduce manufacturing costs, provide a minimum cross-sectional profile and increase uniformity of light emission. Light emitting devices according to embodiments of the present disclosure can comprise a primary optic that produces a customized light beam profile, for example, directing a substantial portion of emitted light in a lateral direction out of the sides of the primary optic. Primary optics according to the present disclosure can be many shapes, including shapes similar to a cylinder or a truncated cone. These primary optics can also comprise a concave portion allowing for further control over emitted light.

The LEDs are mounted on a back surface of a shallow cylindrical housing. A secondary optic, such as a diffuser for example, may be placed over the open end of the housing such that substantially all of the light from the LEDs interacts with the secondary optic before it exits the device. The secondary optic may have non-uniform optical characteristics that correlate with the position of the LEDs on the back surface The back surface may be contoured with reflective ridges to reflect light moving laterally within the housing away from the back surface and toward the secondary optic to be emitted as useful light from the device.

These and other further features and advantages of the invention would be apparent to those skilled in the art from the following detailed description, taking together with the accompanying drawings, wherein like numerals designate corresponding parts in the figures, in which:

BRIEF DESCRIPTION OF THE DRAWINGS

FIG. 1A-1E are magnified cross-sectional, horizontal side, top perspective, top, and vertical side views, respectively, of a light emitting device incorporating features of the present invention.

FIGS. 1F-1H show simulation results of the light emitting device of FIGS. 1A-1E.

FIGS. 2A-2E are magnified cross-sectional, horizontal side, top perspective, top, and vertical side views, respectively, of a light emitting device incorporating features of the present invention.

FIGS. 2F-2H show simulation results of the light emitting device of FIGS. 2A-2E.

FIGS. 3A-3E are magnified cross-sectional, horizontal side, top perspective, top, and vertical side views, respectively, of a light emitting device incorporating features of the present invention.

FIGS. 3F-3H show simulation results of the light emitting device of FIGS. 3A-3E.

FIGS. 4A-4E are magnified cross-sectional, horizontal side, top perspective, top, and vertical side views, respectively, of a light emitting device incorporating features of the present invention.

FIGS. 4F-4H show simulation results of the light emitting device of FIGS. 4A-4E.

FIGS. 5A-5E are magnified cross-sectional, horizontal side, top perspective, top, and vertical side views, respectively, of a light emitting device incorporating features of the present invention.

FIGS. 5F-5H show simulation results of the light emitting device of FIGS. 5A-5E.

FIGS. 6A-6E are magnified cross-sectional, horizontal side, top perspective, top, and vertical side views, respectively, of a light emitting device incorporating features of the present invention.

FIGS. 6F-6H show simulation results of the light emitting device of FIGS. 6A-6E.

FIGS. 7A-7E are magnified cross-sectional, horizontal side, top perspective, top, and vertical side views, respectively, of a light emitting device incorporating features of the present invention.

FIGS. 7F-7H show simulation results of the light emitting device of FIGS. 7A-7E.

FIGS. 8A-8E are magnified cross-sectional, horizontal side, top perspective, top, and vertical side views, respectively, of a light emitting device incorporating features of the present invention.

FIGS. 8F-8H show simulation results of the light emitting device of FIGS. 8A-8E.

FIGS. 9A-9E are magnified cross-sectional, horizontal side, top perspective, top, and vertical side views, respectively, of a light emitting device incorporating features of the present invention.

FIGS. 9F-9H show simulation results of the light emitting device of FIGS. 9A-9E.

FIGS. 10A-10E are magnified cross-sectional, horizontal side, top perspective, top, and vertical side views, respectively, of a light emitting device incorporating features of the present invention.

FIGS. 10E-10H show simulation results of the light emitting device of FIGS. 10A-10E.

FIGS. 11A-11E are magnified cross-sectional, horizontal side, top perspective, top, and vertical side views, respectively, of a light emitting device incorporating features of the present invention.

FIGS. 11F-11H show simulation results of the light emitting device of FIGS. 11A-11E.

FIG. 12 is a cross-sectional view of a light emitting device incorporating features of the present invention.

FIG. 13 is a cross-sectional view of a light emitting device incorporating features of the present invention.

FIGS. 14A-14D are side, perspective, top, and end views of a light emitting device incorporating features of the present invention.

FIGS. 15A-15D are side, perspective, top, and end views of a light emitting device incorporating features of the present invention.

FIGS. 15E and 15F show simulation results of the light emitting device of FIGS. 15A-15D.

FIGS. 16A-16D are side, perspective, top, and end views of a light emitting device incorporating features of the present invention.

FIGS. 16E and 16F show simulation results of the light emitting device of FIGS. 156-16D.

FIGS. 17A-17D are side, perspective, top, and end views of a light emitting device incorporating features of the present invention.

FIGS. 17E and 17F show simulation results of the light emitting device of FIGS. 17A-17D.

FIGS. 19A-19D are side, perspective, top, and end views of a light emitting device incorporating features of the present invention.

FIGS. 19E and 19F show simulation results of the light emitting device of FIGS. 19A-19D.

FIGS. 20A-20D are side, perspective, top, and end views of a light emitting device incorporating features of the present invention.

FIGS. 20E and 20F show simulation results of the light emitting device of FIGS. 20A-20D.

FIGS. 21A-21D are side, perspective, top, and end views of a light emitting device incorporating features of the present invention.

FIGS. 21E and 21F show simulation results of the light emitting device of FIGS. 21A-21D.

FIGS. 22A-22D are side, perspective, top, and end views of a light emitting device incorporating features of the present invention.

FIGS. 22E and 22F show simulation results of the light emitting device of FIGS. 22A-22D.

FIGS. 23A and 23B are a cross-sectional concentration diagram and cross-sectional view, respectively, of a diffuser incorporating features of the present invention.

FIGS. 24A-24C are a cross-sectional concentration diagram, cross-sectional view, and magnified cross-sectional view, respectively, of a diffuser incorporating features of the present invention.

FIGS. 25A and 25B are cross-sectional views of diffusers incorporating features of the present invention.

DETAILED DESCRIPTION OF THE INVENTION

Figure 1F:
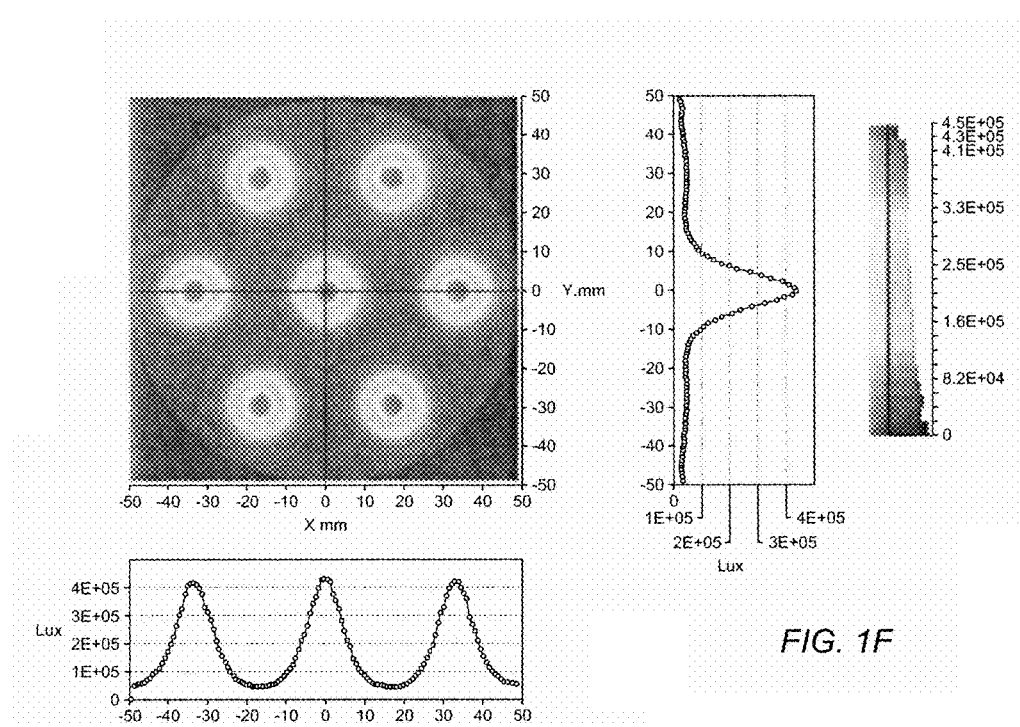

Embodiments of the present invention provide an efficient lighting module having a minimized cross-sectional profile (i.e., depth) while achieving a substantially uniform luminance distribution across an emitting surface of the module with minimal light loss. Multiple solid state light sources such as LEDs, for example, are disposed on a back surface of the module housing. A primary optic may be used to control the light that is emitted from each LED or LED cluster to provide a desired optical output beam profile. A secondary optic, such as a diffuser can be attached to the module such that it defines the emission surface. The diffuser element may have a non-uniform distribution of diffusive elements across its surface or throughout its volume to selectively scatter light that is incident on specific areas of the diffuser. The back surface of the module comprises a reflective material and may be shaped in various ways to redirect light from the LEDs into a specific output profile.

Embodiments incorporating features of the present invention can provide features such as primary optics, secondary optics and reflectors arranged to interact with light and control the direction of emitted light. These features can be arranged, for example, to direct light obliquely or out of the sides of LED packages and modules incorporating features of the present invention. This increases the distribution and/or intensity of light at angles other than the 0° (head-on) angle, reducing the perception of point sources, or that light is originating from multiple points rather than being uniformly emitted from the device.

Embodiments of the module disclosed herein may provide an LED-based module with a variance in output irradiance/illuminance that is <25%, <10%, or <5%, for example.

Embodiments of the module disclosed herein may provide an LED-based module with an optical efficiency (fraction of light generated from the LEDs that is emitted from the module) that is >80% or >90%, for example.

Embodiments of the module disclosed herein may provide an LED-based module with a height-to-width ratio of <0.1 and LED density of <1 mm$^2$ of LED chip material per 1000 mm$^2$ of source area.

It is understood that when an element is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one element to another. It is understood that these terms are intended to encompass different orientations of the device in addition to the orientation depicted in the figures.

Although the ordinal terms first, second, etc., may be used herein to describe various elements, components, regions and/or sections, these elements, components, regions, and/or sections should not be limited by these terms. These terms are only used to distinguish one element, component, region, or section from another. Thus, unless expressly stated otherwise, a first element, component, region, or section discussed below could be termed a second element, component, region, or section without departing from the teachings of the present invention.

As used herein, the term "source" can be used to indicate a single light emitter or more than one light emitter functioning as a single source. For example, the term may be used to describe a single blue LED, or it may be used to describe a red LED and a green LED in proximity emitting as a single source. Thus, the term "source" should not be construed as a limitation indicating either a single-element or a multi-element configuration unless clearly stated otherwise.

The term "color" as used herein with reference to light is meant to describe light having a characteristic average wavelength; it is not meant to limit the light to a single wavelength. Thus, light of a particular color (e.g., green, red, blue, yellow, etc.) includes a range of wavelengths that are grouped around a particular average wavelength. Furthermore, the term "color" is meant to include wavelengths outside the visible spectrum, such as ultraviolet and infrared wavelengths, for example.

Several simulations were performed to model the performance light module according to embodiments of the present invention. All simulations referred to herein were created using the LightTools program from Optical Research Associates (see www.opticalres.com). LightTools is a software suite well-known in the lighting industry for producing reliable simulations that provide accurate predictions of performance in the real world. The simulations referred to herein were based on LEDs having the characteristics of Cree XTE HEW components containing DA1000 chips. Simulations of the various embodiments discussed below include one or more of: a false color image graph showing the luminous emittance (lux, or lumens per square meter) from the light sources when the top of the module is viewed head on; graphs indicating luminous emittance (lux) vs.

vertical/horizontal position (mm); graphs indicating luminous intensity (lumens per steradian) vs. angle position (degrees); a polar graph showing relative luminous intensity vs. viewing angle; and an image representing the expected visual appearance of the module in operation.

FIG. 1A is a cross-sectional view of an LED package 100 that can be used in lighting modules incorporating features of the present invention. The LED package 100 is mounted on the back surface 114 of the light module housing 112. Here, the LED package 100 comprises a hemispherical encapsulant 104 (standard in Cree XTE components) over an LED chip 102. FIGS. 1B-1E show several perspective views of the housing 112 with the LED packages 100 disposed on the back surface 114. FIG. 1B shows a horizontal side perspective view. FIG. 1C shows a top perspective view. FIG. 1D shows a bottom perspective view and FIG. 1E shows a vertical side perspective view. The housing 112 can come in many different shapes, widths (w) and depths (d). In the simulations and embodiments described herein, the housing is cylindrical, w=100 mm, and d=10 mm. Many of the embodiments herein include a 1 mm base and a 1 mm diffuser, such that the distance from a mount surface to the backside of a diffuser (h) is 8 mm. In this embodiment, lighting module 110 comprises seven LED packages 100, disposed on a cylindrical housing 112 comprising a back surface 114 which comprises a Lambertian reflector that is 90% reflective. The housing 112 also includes an angled annular sidewall 116, which is angled slightly outward. The output correlated color temperature (CCT) in this embodiment is 3000 K. It is understood that many other module arrangements using components with different attributes than those described above are possible; for example, modules with fewer or more than seven LED packages are possible.

FIGS. 1F-1H show simulation data of the lighting module 110 described above in FIGS. 1A-1E. FIG. 1F shows a false color image graph of the module 110 and two scan line graphs of luminous emittance along y=0 mm (the horizontal graph) and x=0 mm (the vertical graph). As shown by the false color image and the image representing the visual appearance of the module 110 in operation (shown in FIG. 1H), the light distribution across the module 110 is non-uniform with several apparent hot spots/point sources shown over the individual LEDs 100. The emittance graphs show large variations in luminous emittance across both the x-axis and the y-axis with spikes in intensity directly over the emitters and valleys there between. These spikes and drops indicate a high module max/min ratio. These variations in emittance as a function of position should be minimized in a module with a more uniform emittance.

FIG. 1G is a polar graph showing relative emittance vs. emission angle (in polar increments of 15°). As expected with LEDs comprising a hemispherical primary optic, the emittance follows a generally Lambertian pattern.

In order to improve uniformity of the luminance across the visible light emitting surface, several additional components can be added to and/or substituted into the lighting module of FIGS. 1A-1E above. These additional components are discussed below.

In some embodiments, a custom primary optic can be substituted in for the standard hemispherical encapsulant. The custom primary optic approach provides a customizable output light beam profile from the individual LED components in the module. For example, the primary optic can initially direct light from the LED in a lateral direction (i.e., in a direction flatter than the primary emission orthogonal to the face of the LED chip or at an angle wider than the primary emission of the chip at 0°) to improve light uniformity. A primary optic can be fabricated directly on the LED component in close proximity to the LED chip(s), allowing for a more compact design (important for low-profile modules) which can be more efficient compared to a corresponding secondary optical element (fewer number of interfaces in the light path, and low optical-loss materials, such as silicones, which are typically used for primary optic fabrication may be used compared to more lossy materials such as acrylics and polycarbonates typically used for secondary optics). Incorporating a custom primary optic rather than a secondary optic can help reduce overall system cost (fewer piece parts) and, since no sensitive alignment of assembled parts is required, facilitate system fabrication.

In contrast to FIG. 1A above, FIG. 2A shows the same module, except with the standard hemispheric encapsulant 104 replaced with a custom primary optic 204 designed to distribute at least a portion of the light in a lateral direction. FIG. 2A is a cross-sectional view of an LED package 200 comprising an LED 202 with a custom primary optic 204 thereon. As shown in FIG. 2A, the primary optic 204 can comprise a cylindrical, substantially cylindrical, or frusto-conical shape, and can have sidewalls 220 that are angled. In the FIG. 2A embodiment the sidewalls 220 are only slightly angled inward from vertical. The primary optic 204 can further comprise a concave portion 222. In the embodiment shown in FIG. 2A, the primary optic comprises a 150 µm fillet (or rounded corner) 224 with the characteristics shown, although it is understood that many different primary optics are possible. LED package 200 can be mounted on a reflective back surface of housing 208. The primary optic 204 can help to redirect light in a more lateral or flatter direction such that light emits at an angle further from 0° than it otherwise would.

In the FIG. 2 embodiment, as well as the embodiments of FIGS. 1 and 5-11, the LED packages are spaced by a range (r) of about 34 mm, with a distance from a mount surface to diffuser (h) of about 8 mm. As discussed above, the r to h ratio of a module has a substantial effect upon the uniformity of the module. The r to h ratio of these modules is approximately 4.25:1. Other embodiments of modules according to the present invention have r to h ratios of greater than 1, 1.5 or greater, 2.0 or greater, 2.5 or greater, 3.0 or greater, 3.5 or greater, 4.0 or greater, or greater than 4.25. As shown in FIG. 1, a module with hemispherical primary optics and an r:h ratio of 4.25 often produces a luminous emittance that is far from uniform and with a high max/min ratio (specifically, see FIG. 1F). The effect of the r to h ratio can be seen in modules of varying sizes, including modules smaller than those described herein and larger modules such as floodlights.

FIGS. 2B-2E show horizontal side, perspective, top, and vertical side views of a module 210 with a housing 212 and LED packages 200 disposed on a back surface 214 of the housing 212. FIGS. 2B-2E are similar to FIGS. 1B-1E in all regards (i.e., r value, h value, width, depth, and reflectivity of the back surface) except that the LED packages 200 in FIGS. 2B-2E have primary optics 204 thereon instead of hemispheric encapsulants similar to the encapsulant 104.

Figure 2F:
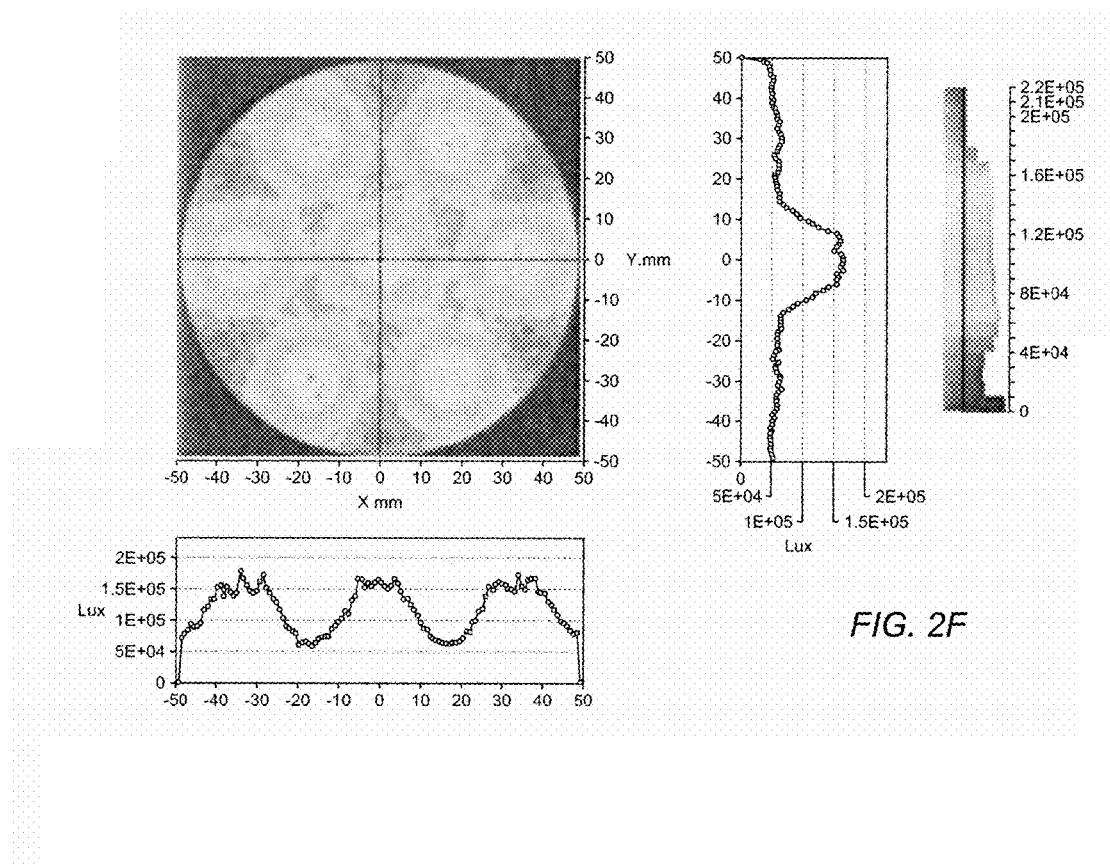

Simulation data regarding the effect of the primary optic 204 on the light intensity across the face of the lighting module of FIGS. 2A-2E can be observed in FIGS. 2F-2H. As can be seen in the false color image graph of FIG. 1F and the simulated visual appearance of FIG. 1H, the light distribution of the module has been significantly improved in terms of uniformity (note the difference in the scale used for the plots of FIG. 1F and FIG. 2F). While hotspots remain, they are less pronounced than those of FIG. 1F. Further, as can be seen in the scan line luminous emittance graphs, the difference between the peaks and valleys are not as high, indicating a lower max/min ratio and better uniformity. Finally, these improvements come at a minimal loss in optical efficiency (defined as the ratio of light out of the module to light emitted out the LED packages); one embodiment of a module 210 was shown by modeling to emit at about 97% the efficiency of the module 110.

The polar graph of relative emittance shows that the 0° emittance is actually less than that of emittance at 15°, 30°, and 45°. In a polar graph of a module with perfectly uniform emittance, the emittance line will be parallel to a segment of one of the ovular relative emittance lines. The emittance shown in FIG. 2G is much more uniform across angles from −60° to 60° than the emittance shown in FIG. 1G.

The module 210 shown in FIGS. 2A-2E has an output with a correlated color temperature (CCT) of 2991K and has an optical efficiency that is 97% that of the base module 110 shown in FIGS. 1A-1E. These results demonstrate that a more uniform module emittance can be achieved with a minimal reduction in efficiency.

FIGS. 3A-3E depict a module 310 similar to the module 210 from FIG. 2, but with LED packages 200 that are more closely spaced to one another, as best seen when comparing FIG. 2D to FIG. 3D. In this particular embodiment, the LED packages 300 on the housing 312 are spaced by a range (r) of about 25 mm, although it is understood that modules with smaller or larger r values are possible. The r to h ratio of the module 210 is approximately 3.125. The module 310 emits with a CCT of about 2913K, similar to that of the module 210.

Figure 3F:
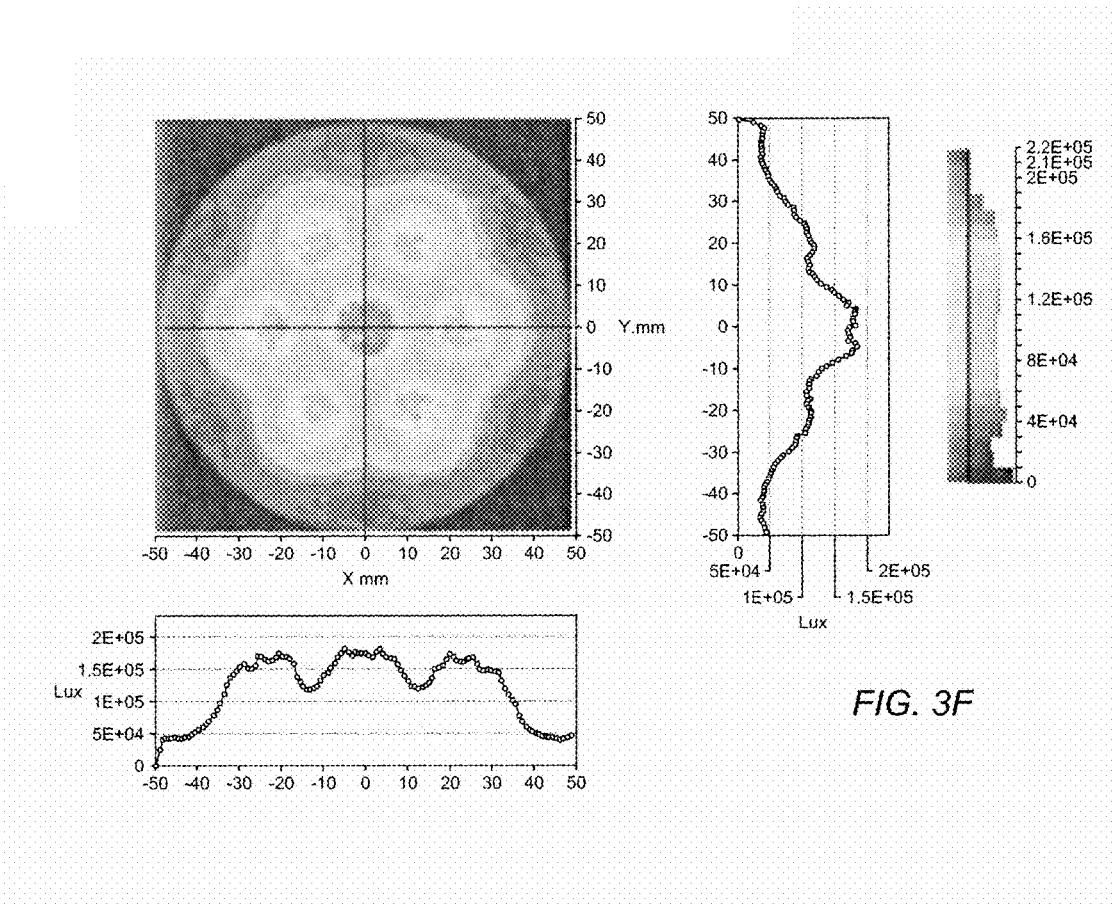

FIGS. 3F-3H show graphs corresponding to those of FIGS. 2F-2H, but showing simulated data for the module 310. As can be seen in FIGS. 3F and 3H, the module 310 does not have as uniform a module emittance distribution, as the edges of the module are less luminous than the edges of the module 210. The hotspots generated by the LEDs 300 are also more pronounced, especially in the middle of the module 310, since the LEDs 300 contribute emittance causing one another's hotspots due to the proximity of the LEDs. While the r to h ratio of the module 310 is lower than that of the module 210, the module 310 comprises the same number of packages (seven) as the module 210, and thus the LED packages are concentrated in a smaller area. Because of the concentration in a small area, the edges of the module 310 emit with less luminous emittance than the center of the module 310. This is also shown by the luminous emittance graph along y=0: the minimum values on the edges of the graph are lower than values on the edges of the module 210 graph.

FIGS. 4A-4E depict a module 410 similar to the module 310 from FIG. 3, but comprising a customized contoured reflective back surface 414 which itself includes a raised portion 414a. A contoured reflective back surface, such as the contoured reflective back surface 414, can serve as a virtual source. A virtual source gives the impression to a viewer that light is originating from the virtual source, when in reality light is only being reflected from the virtual source and originates elsewhere.

Back surfaces used in embodiments of the present invention are many and varied. In one embodiment of the present invention, the back surface comprises a diffuse reflective surface. In some embodiments of the present invention, a back surface can comprise a polymeric or film material designed to reflect light emitted from an emitter on a light bar. In some embodiments the back surface can be white. In some embodiments the back surface comprises a white plastic, such as white plastic sheet(s) or one or more layers of microcellular polyethylene terephthalate ("MCPET"), and in some embodiments the back surface comprises white paper. In some embodiments back surface can comprise a white film, such as White97™ Film available from WhiteOptics, LLC, of New Castle, Del. In other embodiments the back surface can comprise metal, including but not limited to WhiteOptics™ Metal, available from WhiteOptics, LLC, or similar materials. In some embodiments, the back surface can be a plastic or metal device that is coated or painted with a reflective material or another base material coated with a reflective material. Materials can also include specular back surfaces which can help directly control the angle of redirected light rays, Lambertian reflectors, and combinations of diffuse, specular, and Lambertian reflectors.

Reflective back surfaces used in embodiments of the present invention can also be textured to encourage light scattering. Textured reflectors are described in U.S. patent application Ser. No. 13/345,215 to Lu et al. and entitled "Light Fixture with Textured Reflector," and micro-optics and optical texturing are described in U.S. patent application Ser. No. 13/442,311 to Lu et al. and filed on Apr. 9, 2012, both of which are commonly assigned with the present application and both of which are fully incorporated by reference herein in their entirety.

The sidewalls 416 of the module 410 are more angled than the sidewalls 316 of FIG. 3, and have an angle of approximately 45°. Sidewalls such as the sidewalls 316, 416 can comprise a material similar to or the same as the adjacent back surface. In the embodiment shown, the raised portion 414a surrounds a central LED 200. The LED arrangement is the same as that shown in FIG. 3.

Figure 4F:
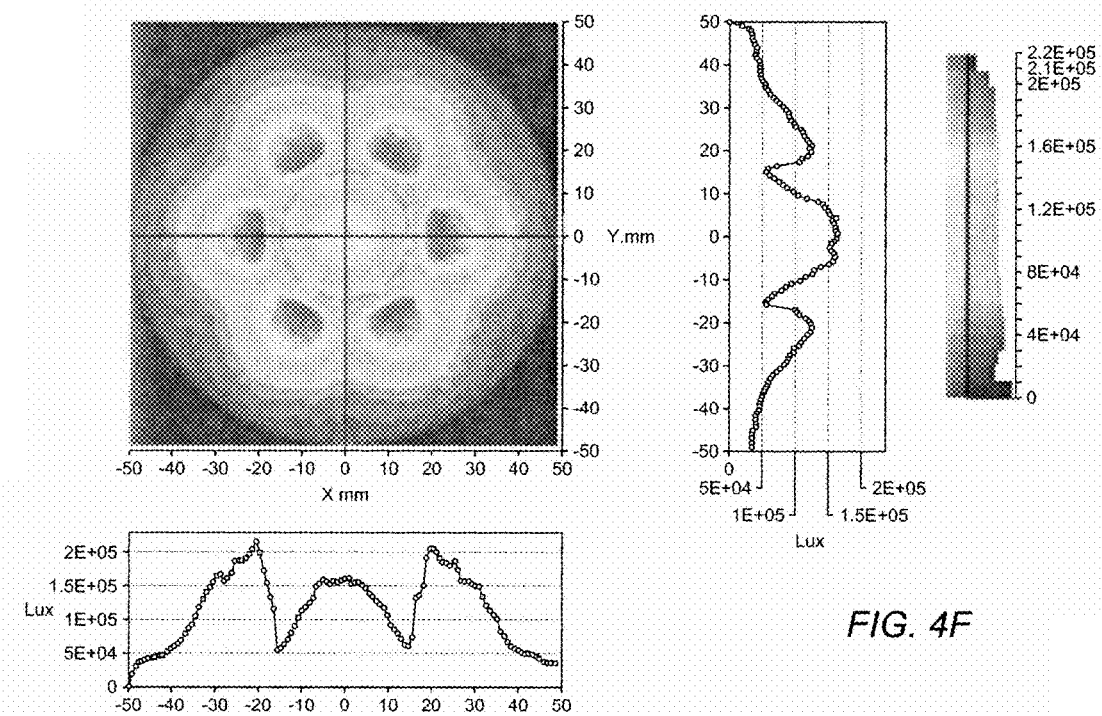

As can be seen in the false color image graph of FIG. 4F, hotspots are produced around the outer edge of the raised portion 414a. The scan line luminous emittance graphs also show a greater variation between the maximum emittance and the minimum emittance, indicating that the module 410 as a whole may have a higher max/min ratio than the module 310 of FIG. 3.

FIGS. 5A-5E depict a module 510 similar to the module 210 from FIG. 2, but further comprising a secondary optic 530 proximate to the LED packages 200 serving as the emission surface and placed over the LEDs 200 and at the front plane of the module 510 (although many other placements are possible). A secondary optic can help minimize light loss while producing a more uniform luminance across the module emitting surface. Light distribution uniformity is increased when the distance from the back surface of the housing to the diffuser is large relative to the spacing of the LED packages in the module. In this particular embodiment, the secondary optic 530 is a light scattering diffuser that is simply a uniform (isotropic) scattering volume. This particular diffuser is 1 mm thick with a mean free path (MFP)= 600 μm, and is spaced at a height (h) equal to 8 mm from the back surface 514 of the housing 512. Many other secondary optics such as beam shaping secondary optics are also possible.

Different embodiments of lighting devices incorporating elements of the current invention can comprise different types of diffusers. Diffusers can serve to provide physical protection to components within the module, such as LEDs. Diffusers can achieve this by, for example, preventing physical damage or dust accumulation, which can negatively affect the module's emission efficiency, intensity, and/or profile. Diffusers also serve to improve the uniformity of the module emission. Depending upon the type of emitters and the reflector used in a module, bright hotspots of light can sometimes be seen on the reflector above the emitter sources. These hotspots are sometimes undesirable and can negatively affect emission uniformity. Diffusers can help to reduce the appearance of these hotspots to a viewer by spreading the light reflected from these hotspots across a wider viewing area. In some cases the light reflected from these hotspots can be spread across the entire luminaire. Even in modules wherein no hotspots or insubstantial hotspots are formed, diffusers can help to diffuse light, broaden the module's emission profile, focus the module's emission profile, and/or create a more uniform appearance.

One embodiment of a diffuser used in a module according to the present invention comprises extruded acrylic with either a diffuser built into the acrylic or a diffuser film coating. Other embodiments of diffusers that can be used in the present invention include diffuse lenses, which scatter all incident light. Further embodiments can comprise acrylics, PMMAs, and/or diffusing additives. Some embodiments can comprise clear acrylics. The types of diffusers described herein are only a few of the types of diffusers that can be used, and are in no way intended to be limiting. Many different types of diffusers are possible. Some types of diffusers that can be incorporated into modules incorporating elements of the present invention are described in U.S. patent application Ser. No. 12/901,405 to Tong et al. and filed Oct. 8, 2010, which is commonly assigned with the present application and fully incorporated by reference herein in its entirety, and U.S. patent application Ser. No. 13/442,311 to Lu et al. Diffusers will be discussed in more detail below, especially with regard to FIGS. 23-25.

Figure 5F:
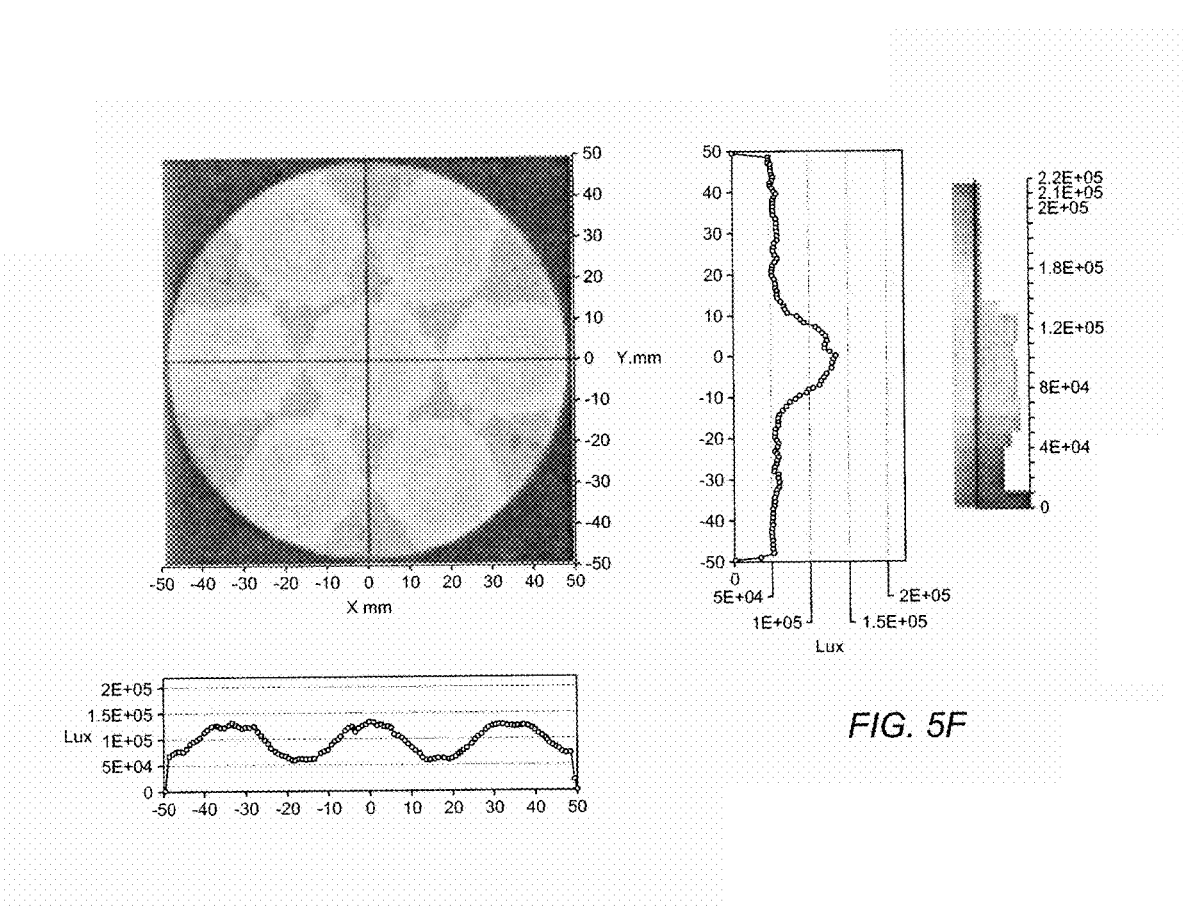
Figure 6F:
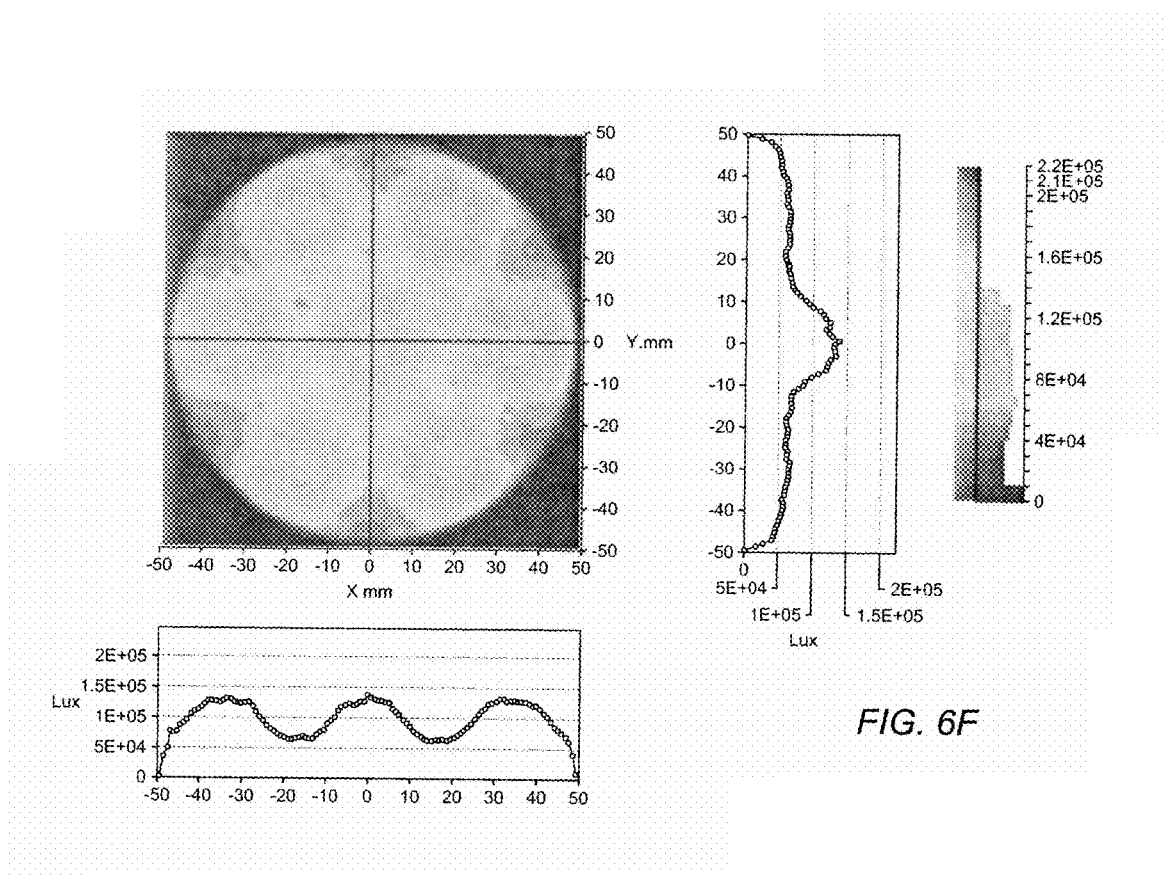

As can be seen by the false color image graph of FIG. 5F, the diffuser 530 helps to diminish the intensity and size of the hotspots shown in the color image graph of FIG. 2F. The scan line luminous emittance graphs of FIG. 5F are also flatter than those of FIG. 2F, indicating that the module 510 may have a better max/min ratio than the module 210 from FIG. and therefore have a more uniform module distribution. Embodiments comprising a diffuser such as the diffuser 530 can operate at about 85% efficiency compared to similar embodiments not comprising a diffuser (e.g., in this case, the module 510 can operate at about 85% the efficiency of the module 210 from FIG. 2) due to losses caused by back-scattering of light into the housing and absorption by module surfaces. Other embodiments can operate at about 80% efficiency or can operate at above 85% efficiency.

FIGS. 6A-6E depict a module 610 similar to the module 510 from FIG. 5, but further comprising a contoured back surface 614. The contoured reflective back surface 614 includes raised ridges 614a in a spider-web formation around a central LED package 200. The simulation data shown in FIGS. 6F-6H shows that the hotspots generated by the module 610 are slightly more intense than those produced by the module 510, but on the whole the contoured reflective back surface 614 does not make a significant difference in either uniformity or emittance, and only a slight difference in emission efficiency from about 85% for the module 510 to about 86% for the module 610.

FIGS. 7A-E depict a module 710 similar to the module 510 from FIG. 5. The module 710 includes a diffuser 730 that is similar to the diffuser 530, but further includes embedded discs 732 within the diffuser 730. In the module 710, these embedded discs 732 are circular and are centered over the emitters 200, although many other shapes and arrangements are possible. The embedded discs 732 have an MFP of 300 μm, half that of the MFP of the remainder of the diffuser 730 (although other embodiments with MFPs less than or more than half of the remainder of the diffuser are also possible). Because the MFP of the embedded discs 732 is half that of the remainder of the diffuser 730, and because the embedded discs 732 are centered above the LEDs 200, light rays above the LEDs 200 (where illuminance is the greatest) are scattered more than light rays that encounter areas of the diffuser 730 other than the embedded discs 732. By only increasing the scattering in the embedded discs 732 as opposed to the entire diffuser 730, it is possible to minimize the number of bounces (and thus optical loss) necessary to achieve a more uniform illuminance of the module 710. Further, in some instances the material used to make the embedded discs 732 can be expensive, and thus not including the material throughout the diffuser 730 can make for a more cost effective module. The embedded discs 732 of FIG. 7 are approximately 20 mm in diameter and 0.998 mm thick, although wider and/or thinner or thicker discs are possible. Further, many other structures may be used to provide non-uniform scattering properties within a diffuser such as the diffuser 730.

Figure 7F:
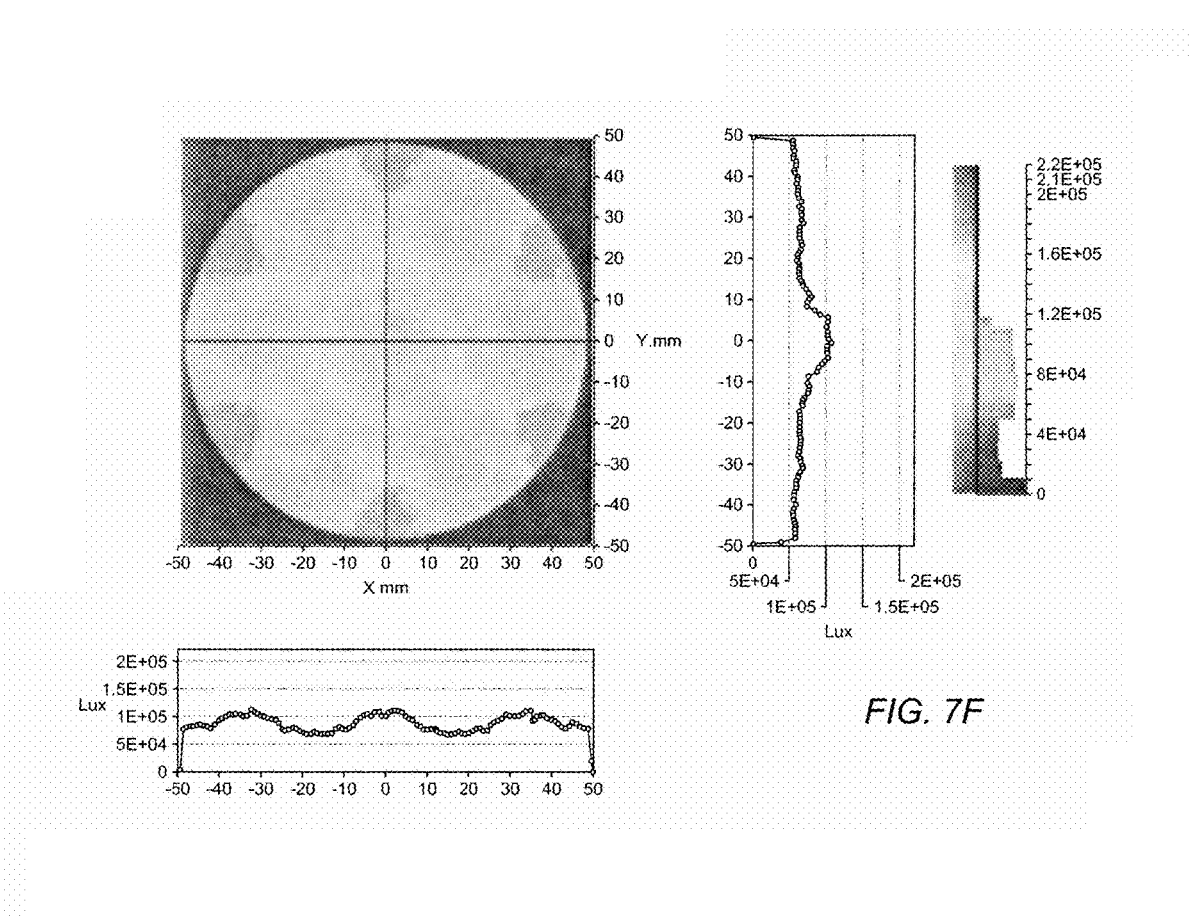
Figure 8F:
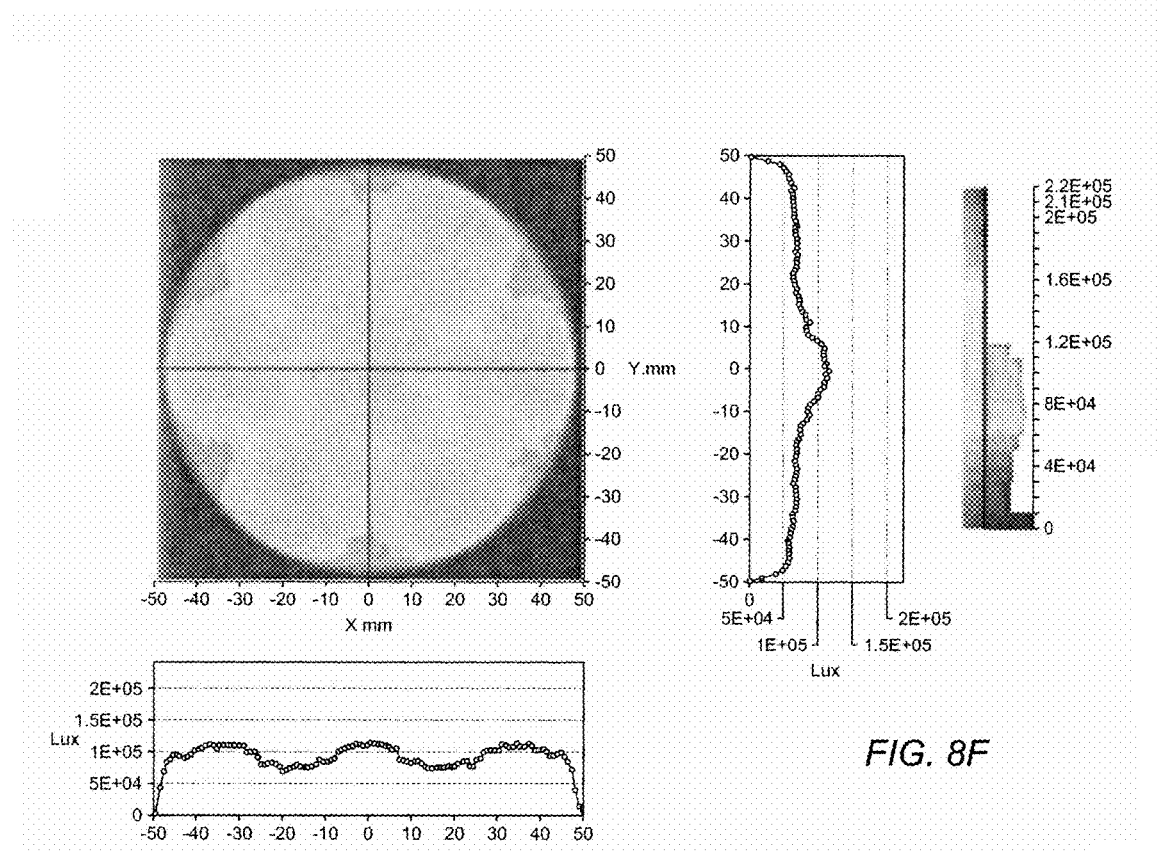

FIGS. 7F-H show simulated emission data of the module 710. As can be seen when comparing FIG. 7F to FIG. 5F, the addition of the embedded discs 732 greatly reduces the intensity of hotspots. Further, the light distribution across the axes of the module 710 is shown to be flatter than the light distribution across the axes of the module 510, indicating that the module 710 may have a lower max/min ration and a more uniform emission distribution. Modules comprising embedded discs can achieve these emission characteristics with minimally increased losses compared to modules with uniform diffusers. For example, the module 710 can have an efficiency of about 82.5% that of the module 210, only about 2.5% less than the module 510. Other similar modules may have efficiencies greater than about 82.5%, e.g. efficiencies of about 85% or greater or about 90% or greater.

FIGS. 8A-E depict a module 810 similar to the module 710 from FIG. 7. The module 810 further includes a contoured reflective back surface 814. The contoured reflective back surface 814a includes a volcano-shaped raised portion 814a surrounding a central LED package 200. The raised portion 814a has gently sloping sides. FIGS. 8F-H show simulated emission data for the module 810. The module 810 with the slightly altered contoured reflective back surface 814 has module uniformity approximately the same as the module 810, but emits at approximately 85% efficiency when compared to the module 210. This is about 2.5% greater efficiency than the module 710.

FIGS. 9A-E depict a module 910 similar to the module 210 from FIG. 2, but comprising a different LED package 900. The LED 900 comprises a dual-cylindrical primary optic 920. The primary optic 920 includes a greater cylindrical portion 920a and one lesser cylindrical portion 920b, although embodiments with more than one lesser cylindrical portion are possible. The primary optic 920 also includes a concave portion 922. It is understood that while the primary optic 904 is referred to as a dual-cylindrical optic, it can comprise more than two cylindrical or substantially cylindrical and/or frustoconical shapes.

Figure 9F:
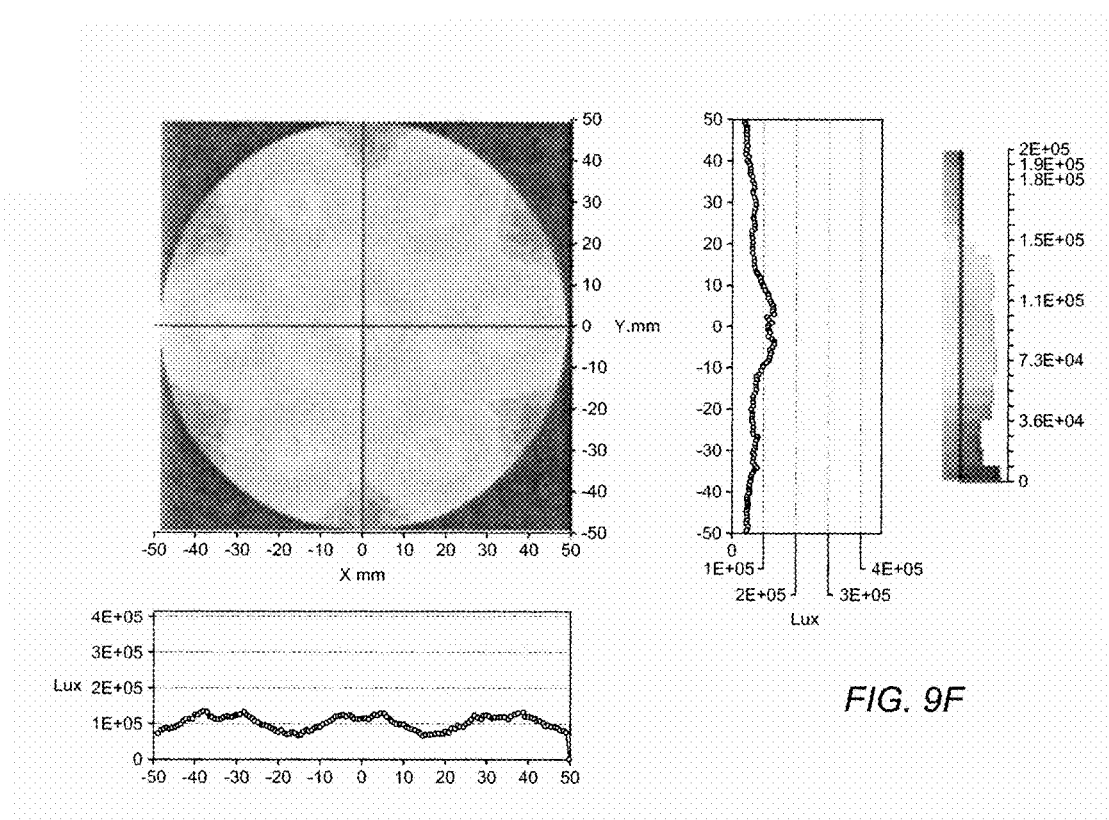
Figure 10F:
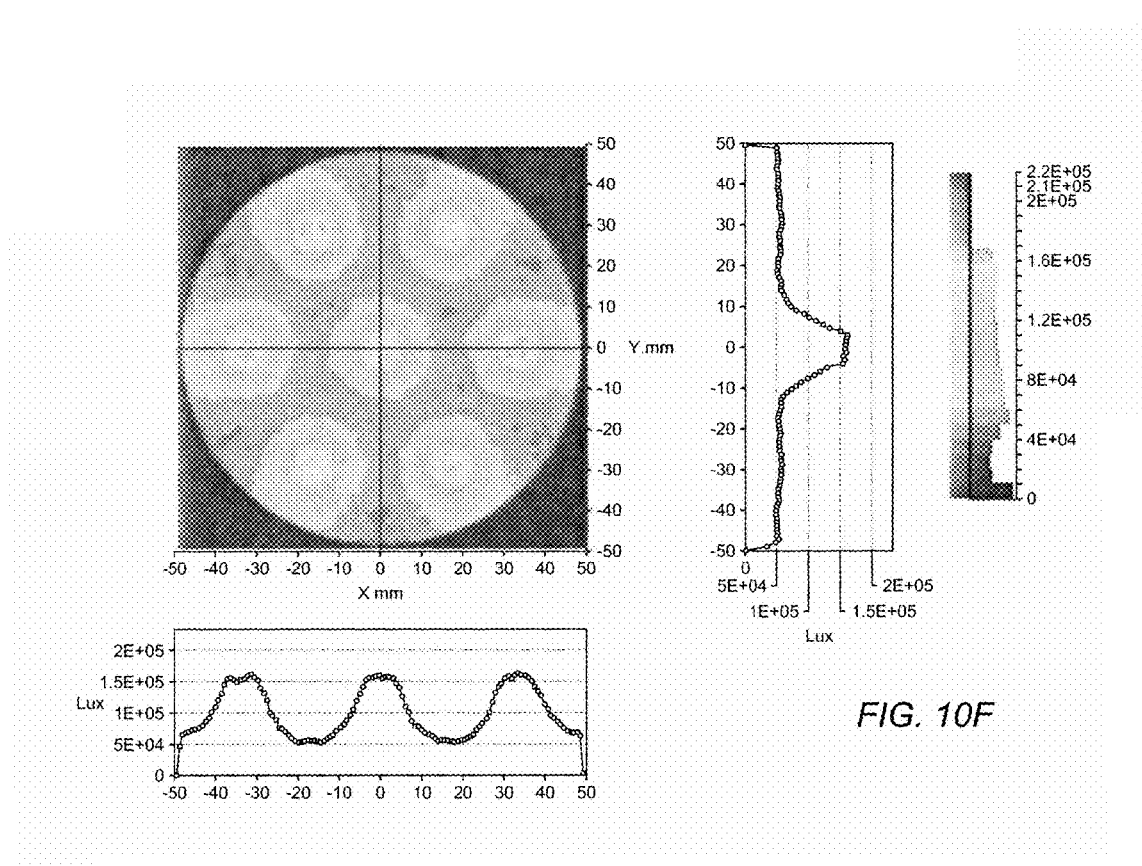
Figure 11F:
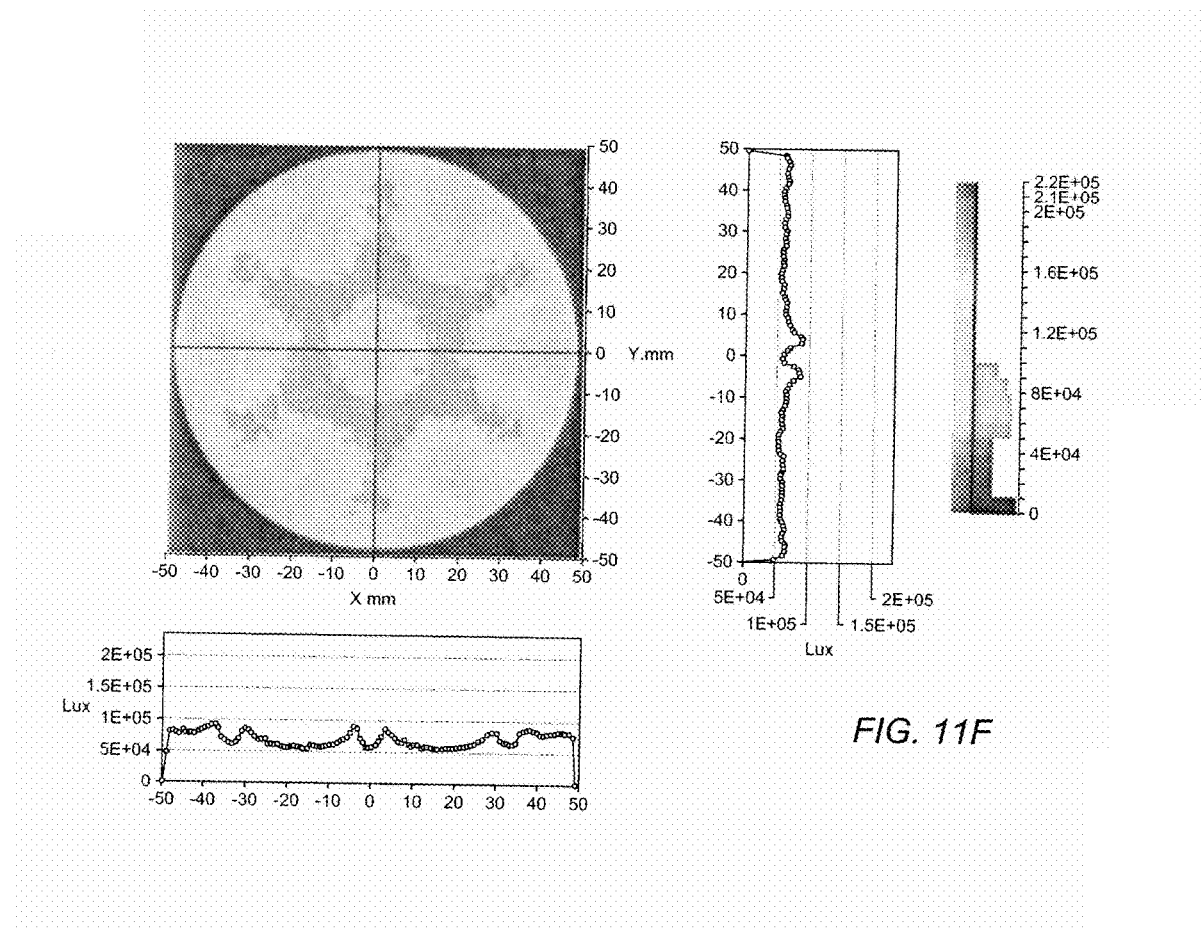

FIGS. 9F-H show simulated emission data of the module 910. As can be seen in FIG. 9F, the emission is substantially uniform along the x and y axes as shown by the scan line luminous emittance graphs. Further, in part because the module 910 does not include a diffuser, the module can emit with an efficiency of about 90% or greater. For example, the simulated data for the module 910 shows an emission efficiency of about 91.7% that of the module 210. One reason the module 910 exhibits improved emission uniformity as well as experiences a loss compared to the module 100 is that the LED packages 900 emit more light to the side as opposed to forward. Because of this, more light is emitted from regions corresponding to the spaces between the LEDs, as well as the regions between the LEDs and the reflective sidewall of the module 910 (contributing to the emission uniformity of the module 910) and more light encounters the reflective back surface 914 and the reflective sidewall 916 (which causes some efficiency loss). Some examples of packages with a sideways emission are described in U.S. patent application Ser. No. 11/247,563 to Keller et al. and entitled "Side-Emitting Optical Coupling Device," and U.S. patent application Ser. No. 12/074,762 to Jacobson et al. and entitled "Optical System for Batwing Distribution," both of which are commonly assigned with the present application and both of which are fully incorporated by reference herein in their entirety.

The embodiments of FIGS. 10 and 11 are substantially similar to the embodiment of FIG. 5, but include LED packages different than the package 200 in the module 510. The module 1010 includes an LED package 1000 with a primary optic 1020 that, similar to the primary optic 920, includes two shaped portions. The lower portion 1020a is substantially frusto-hemispherical, while the upper portion 1020b is substantially cylindrical. The primary optic 1020 also includes a concave portion 1022. Different embodiments comprising differently shaped portions and two or more portions are possible. Some embodiments also comprise one or more LED chips that are off-center from a primary optic. Some embodiments of LED packages comprising two or more portions with specific emission characteristics are described in U.S. patent application Ser. No. 13/804,309 to Wilcox et al. and entitled "LED Dome with Improved Color Spatial Uniformity", which is fully incorporated by reference herein in its entirety.

FIGS. 10E-H show simulated emission data of the module 1010. As can be seen when comparing FIGS. 10E-H to FIGS. 5F-H, the module 1010 still produces substantial hotspots and actually produces a less uniform emission than the module 510 (but with higher maximum emission intensity). Some simulations show embodiments of the module 1010 emitting at about 80% or greater or about 83.1% or greater than the module 210.

FIGS. 11A-E depict a module 1110 similar to the module 510, but including a different LED package 1100. The LED package 1100 includes a primary optic 1120 and is referred to as a sidelooker LED package. Similar packages are described in U.S. patent application Ser. No. 11/247,563. Side mounted LED packages and LED packages with asymmetric reflective cups, for example, can also be used in certain embodiments. As can be seen in FIGS. 11F-H, the module 1110 has a substantially uniform emission. However, this uniformity can sometimes come at the cost of emission efficiency. For example, some embodiments similar to the module 1110 can have an emission efficiency around 74.6% that of the module 210 due to factors such as the presence of a diffuser 1130 and light bouncing off of the back surface 1114 and the reflective sidewall 1116.

While the above embodiments comprise multiple LED packages, embodiments comprising a single LED package are also possible. In such a case, the distance between the LED package and an inside edge of the reflective sidewalls of the package (r') can have a substantial effect upon the uniformity of the module emission. One reason for this is that the reflective sidewalls of the package can act as virtual sources, and thus the edges of the module can have a relatively high brightness. The ratio of r' to h is therefore also one determinative factor in the emission uniformity of the package.

FIG. 12 is a cross-sectional view of another embodiment of an LED package according to the present invention which can be used in embodiments of modules according to the present invention. The package 1200 comprises a chip 1202 and a primary optic 1220. The primary optic 1220 is a bow-tie shaped optic. The bow-tie optic 1220 has a shape similar to two truncated cones attached at their apical top planes; thus, a side view of the bow-tie optic 1220 would appear semicircular. The bow-tie optic 1220 further comprises an open concave portion 1222. The specific bow-tie 1220 has vertical sidewalls 1226. The package 1200 can be mounted to a housing 1212.

FIG. 13 is a cross-sectional view of an embodiment of an LED package 1300 similar to the package 1200, but with a shallower open concave portion 1322 than the open concave portion 1222. As can be seen by the ray traces 1201, both of the packages 1200, 1300 are designed to emit a large portion of emitted light to the sides instead of upward. Further, a shallower open concave portion 1322 results in more light being emitted from the concave portion of the emitting surface of the optical element 1304, although this light may be emitted at high angles as shown by the ray traces 1301a.

Modules according to embodiments of the present invention can comprise many shapes other than the disc shape described with regard to FIGS. 1-11. For example, the module 1410, shown in FIGS. 14A-D, has a generally tubular shape. The module 1410 can be designed to be a linear version of the modules discussed above. The module 1410 can include at least one end portion 1411, which can be a reflective, transparent, and/or diffusive material. Other embodiments do not comprise end portions 1411. The module 1410 includes a secondary optic or diffuser 1430 that is at least partially over LED packages 1400 mounted on a mount 1412 within the module 1410. In some embodiments the diffuser 1430 includes embedded areas of lower MFP, such as over the packages 1400. The mount 1412 can be reflective, such as a 90% or greater Lambertian reflector or any of the other reflectors discussed or incorporated herein. FIGS. 15A-D are close-up views of the packages 1400 used in the module 1410. The packages 1400 comprise a simple hemispherical primary optic 1404.

A sample tubular module 1410 can have a one inch diameter and be fifteen inches long, with a secondary optic 1430 such as a diffuser that is 1 mm thick with an MFP of 600 μm. There can be approximately 1.5 in between packages 1400. These dimensions and measurements are solely exemplary, and many other dimensions and measurements are possible.

Figure 15E:
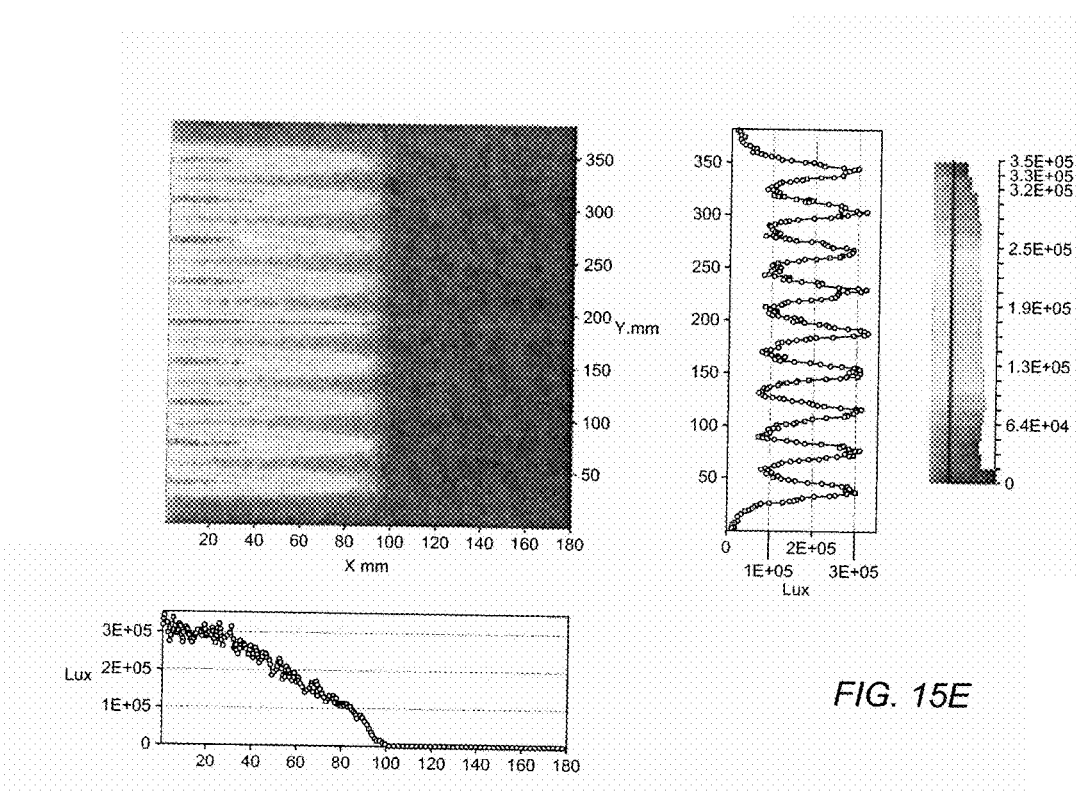
Figure 16E:
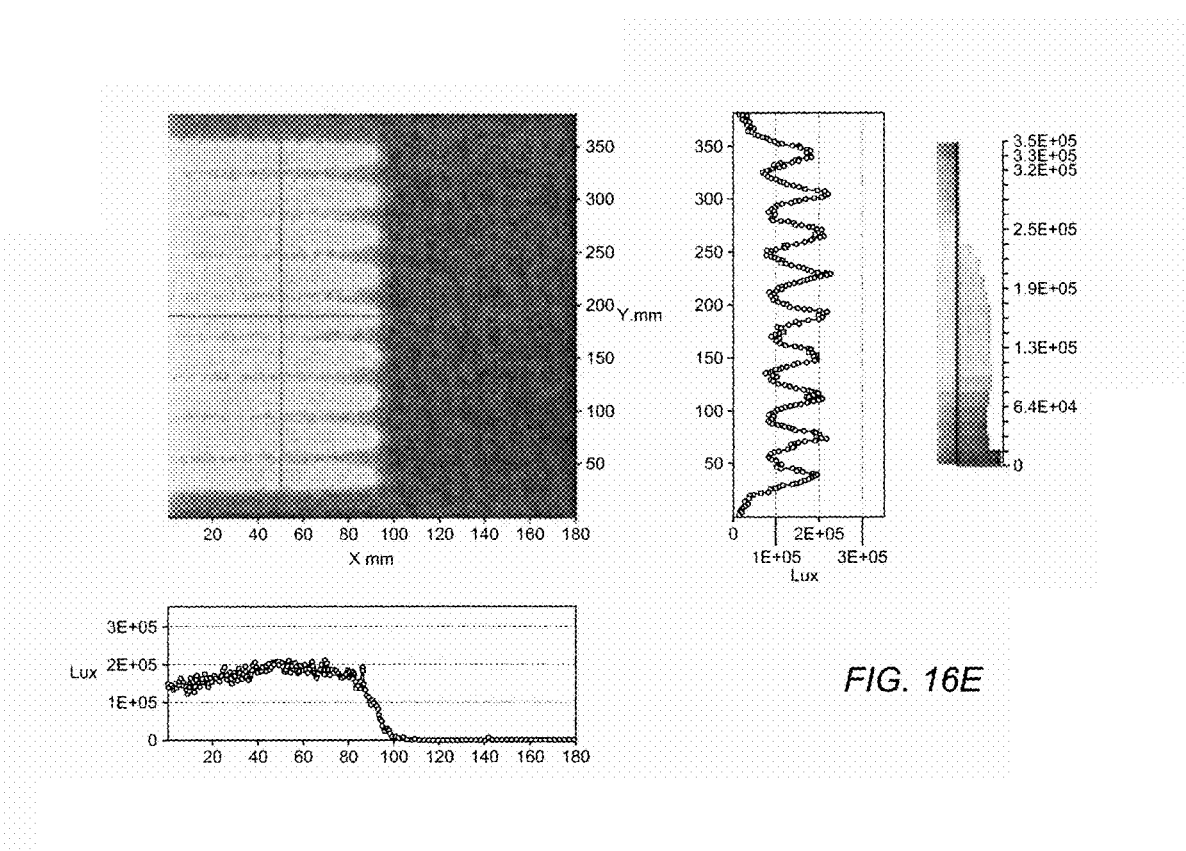
Figure 17E:
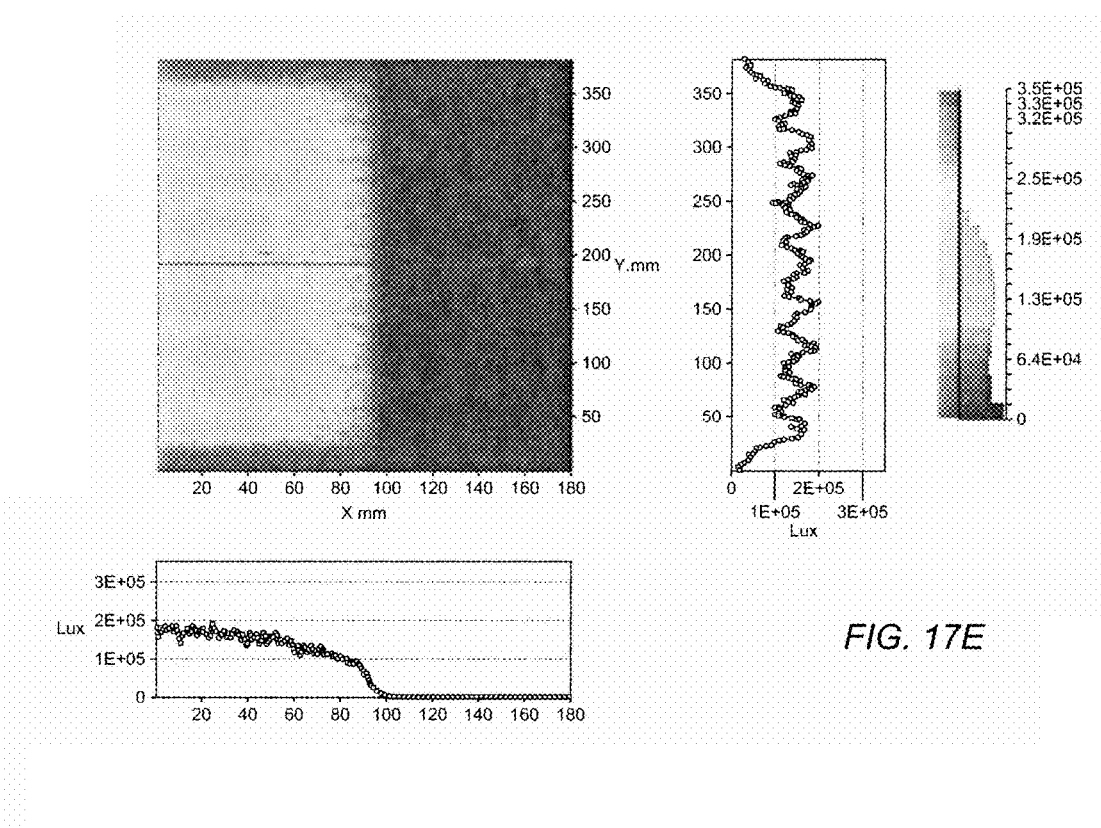
Figures 18A, 18D:
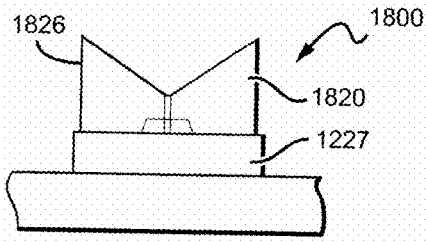
FIGS. 18A-18D are side, perspective, top, and end views of a light emitting device incorporating features of the present invention.
Figure 18B:
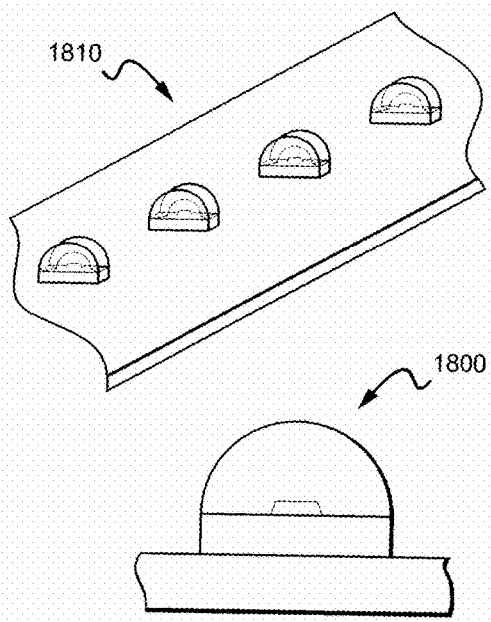
Figure 18C:
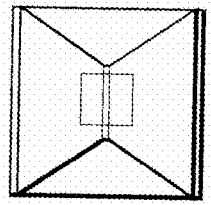
Figure 18F:
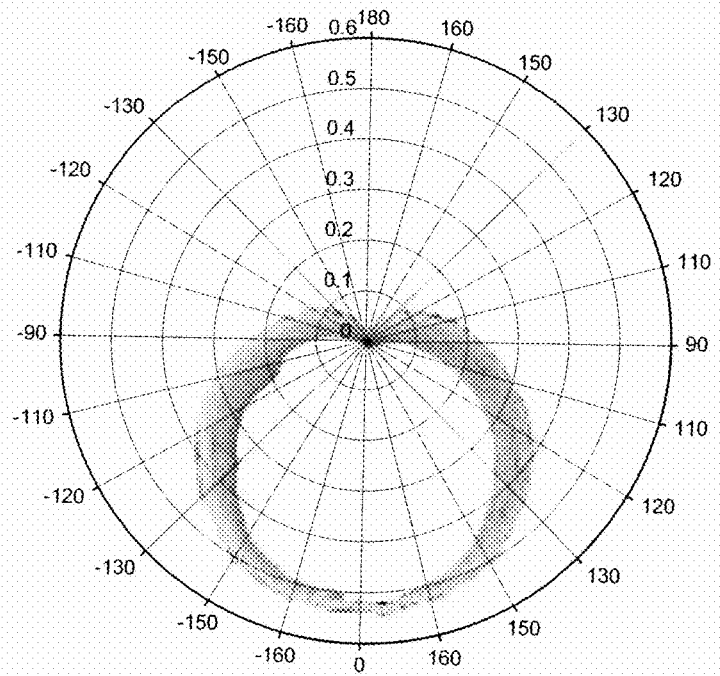
FIGS. 18E and 18F show simulation results of the light emitting device of FIGS. 18A-18D.
Figure 18E:
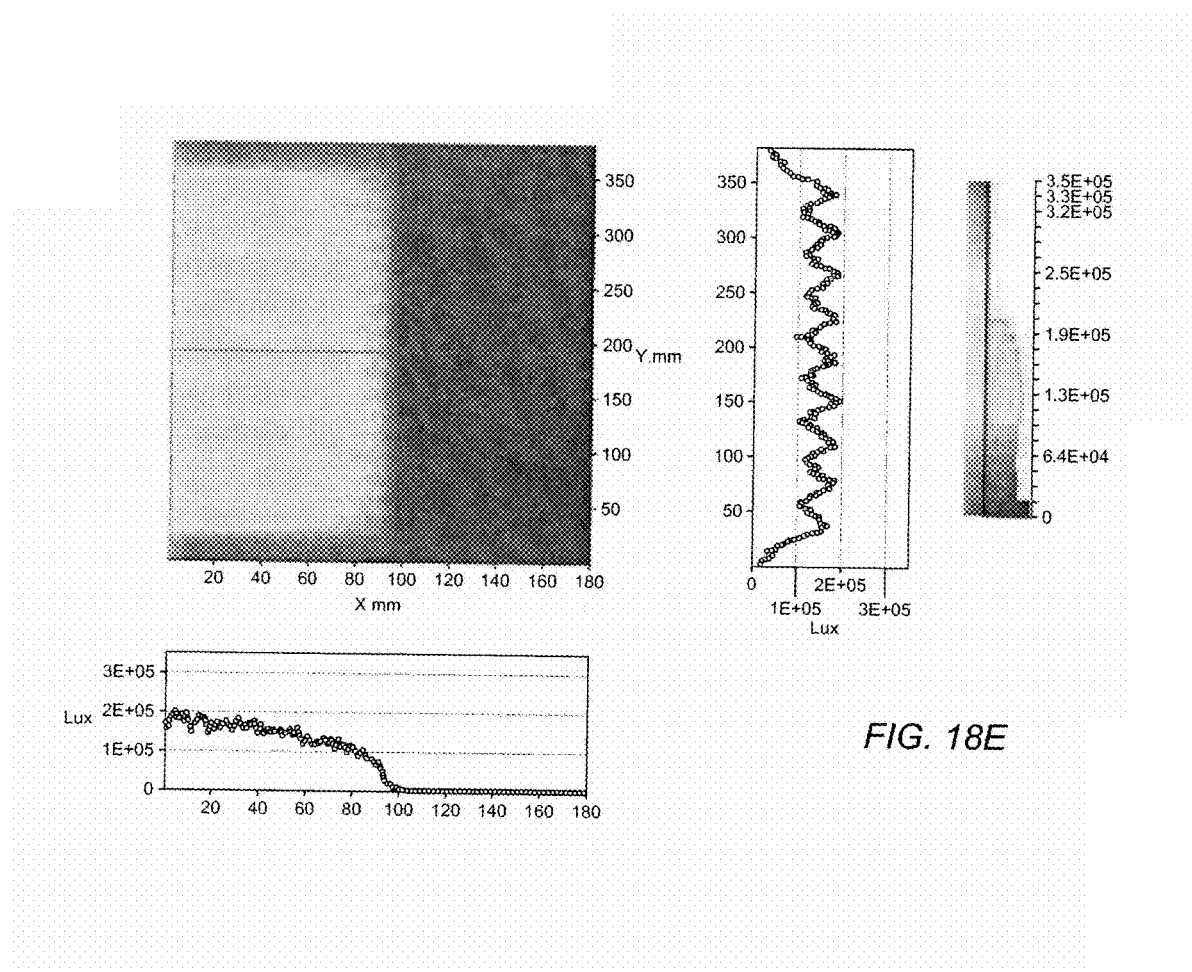
Figure 19E:
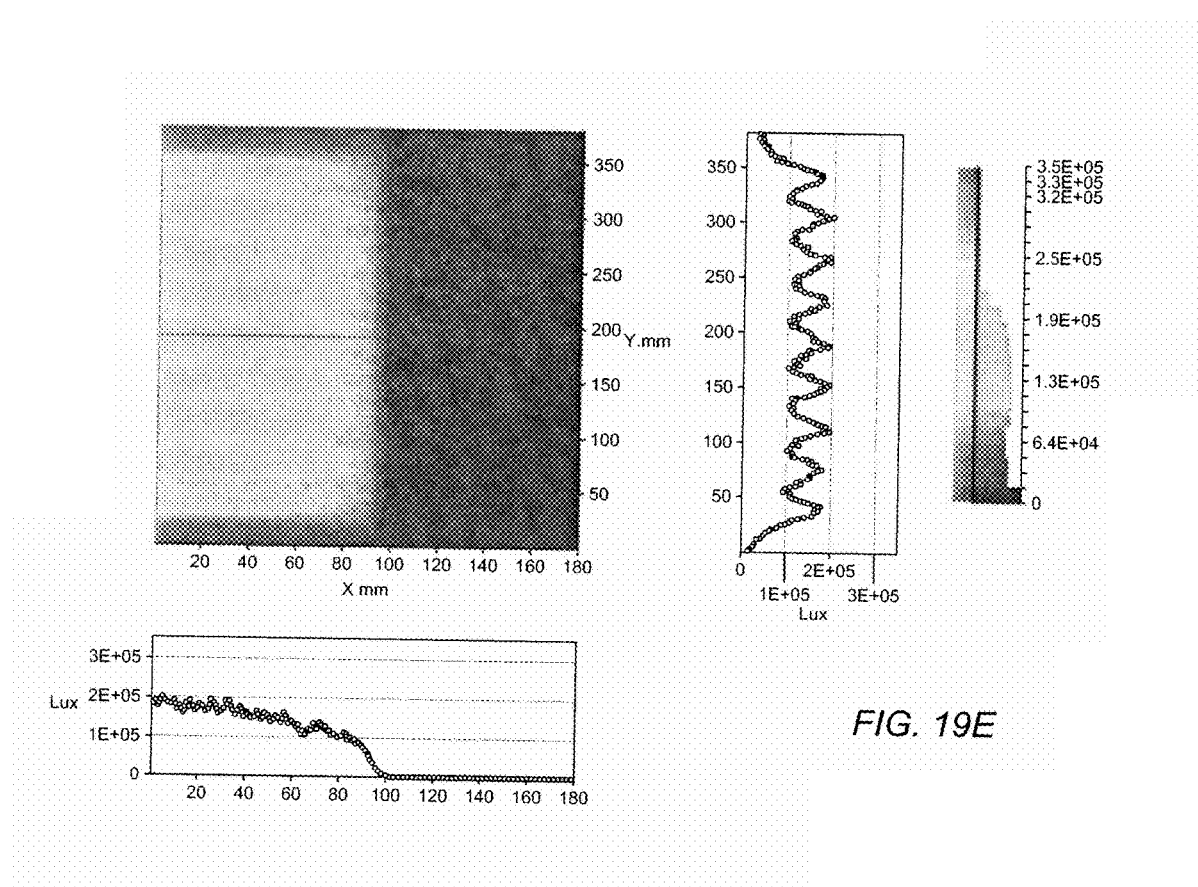
Figure 20E:
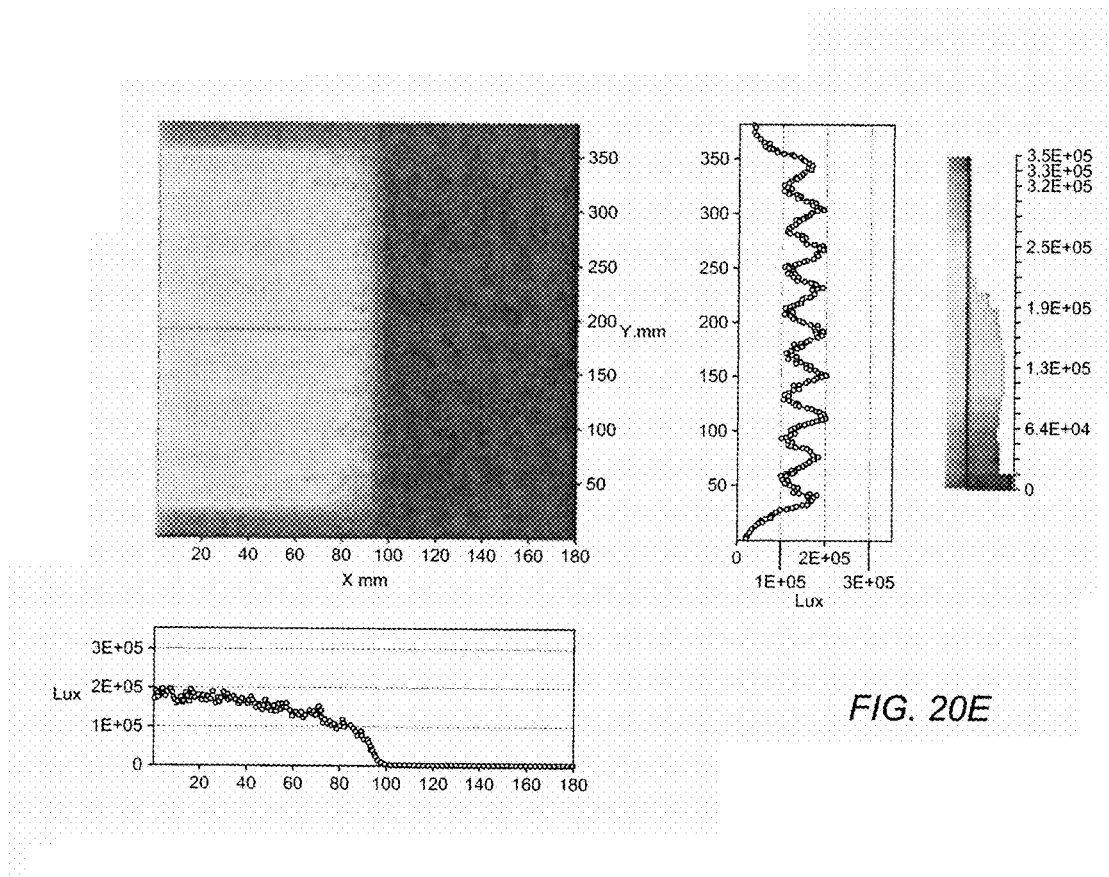
Figure 21E:
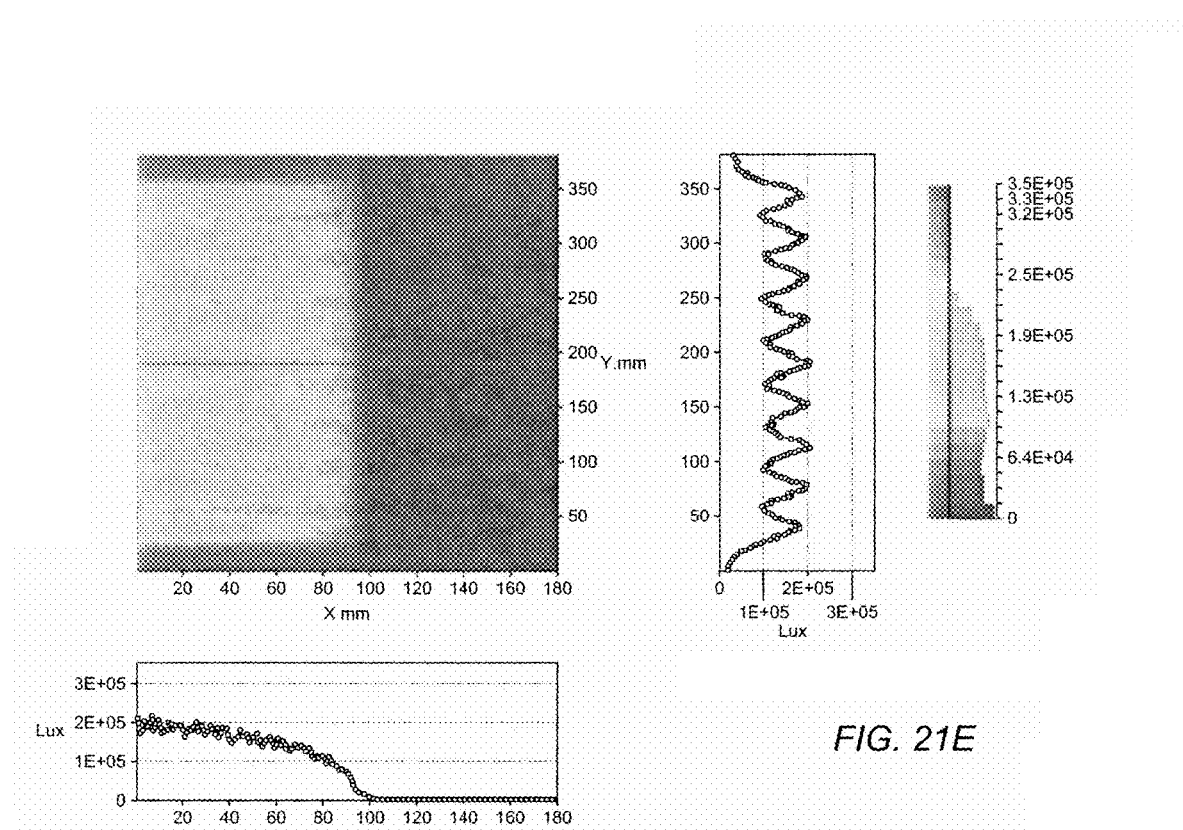
Figure 22E:
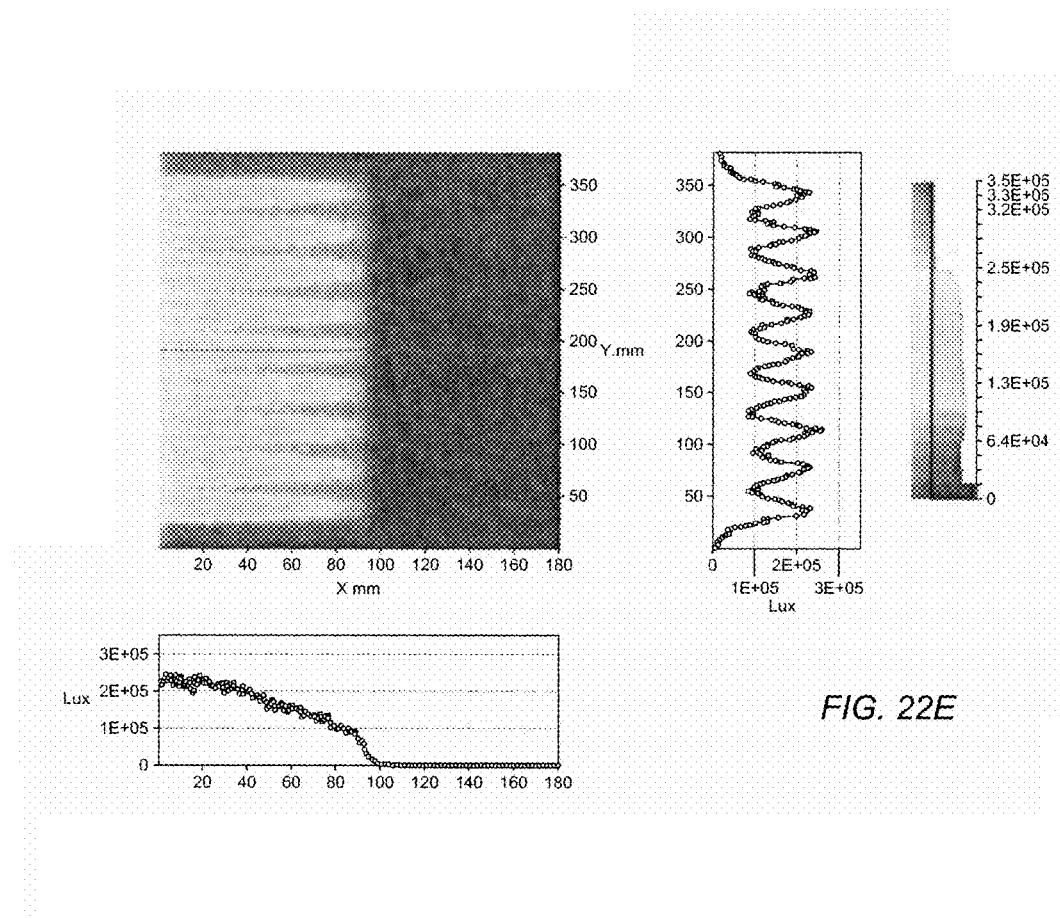

FIGS. 15E-F show simulated emission data of the module 1410 including packages 1400 with hemispherical primary optics 1404. The graphs shown by FIGS. 15E-F are substantially similar to the graphs shown by, for example, FIGS. 1F-G, but the false color image graph and the horizontal scatter plot of FIG. 15E show luminous emittance (lux) vs. viewing angle (degrees) from vertical for a given longitudinal position along the tube (here, Y≈190 mm). As can be seen in this graph, as the viewing angle approaches perpendicular (90°) the luminous emittance approaches zero, and finally reaches zero at an angle of about 100° from forward. The graphs shown in FIGS. 15E-F will be used as control emission characteristics for comparison with the emission characteristics of embodiments comprising different primary optics discussed below.

Many different embodiments of packages can be used in the module 1410 other than packages 1400 with a hemispherical primary optic 1404. FIGS. 16-22 are views and simulated emission data for modules similar to 1410, but comprising packages with non-hemispherical primary optics.

FIGS. 16A-F show close-up views and emission characteristics of a module 1610 including packages 200 with primary optics 204. The packages 200 and primary optics 220 were discussed above with regard to FIG. 2. As can be seen when comparing FIGS. 16E-F to FIGS. 15E-F, the luminous emittance along the x-axis is somewhat flattened due to the use of the primary optics 220. When observed at the center of one of the emitters (e.g., Y≈190 mm), the luminous emittance of the module 1610 flattened from 0° to over 80°, as opposed to downward sloping, as shown in FIG. 15E. Also, the max/min ratio along the Y-axis is reduced compared to FIG. 15E. Further, these benefits are achieved with little loss in efficiency. One simulation of the emission of the module 1610 showed an emission efficiency of 96.1% when compared to the emission of the module 1410.

FIGS. 17A-F show close-up views and emission characteristics of a module 1710 including packages 1200 with primary optics 1220 from FIG. 12. The packages 1200 and primary optics 1220 were discussed above with regard to FIG. 12. The bow-tie primary optic 1220 is specifically designed to redirect light such that it is 1) more lateral/flatter than 0°, and therefore closer to parallel to the mount surface 1712, due to the presence of the concave portion 1222, and 2) emitted more longitudinally along the tubular module 1710 due to the presence of the unrounded flat bottleneck portion 1221. Such an emission pattern has less light exiting directly from an emitter through a diffuser, and thus avoids striping of the module 1710. An example of such a ray trace 1701 is shown in FIGS. 17A-D.

Exemplary dimensions of the bow-tie primary optic 1220 are as follows. The primary optic 1220 can be approximately 1.725 mm high, and have a bottleneck portion 1221 that is approximately 1.4 mm wide. These measurements are only exemplary, as many other dimensions are possible.

As can be seen when comparing FIGS. 17E-F to FIGS. 15E-F and 16E-F, the luminous emittance along the x-axis is flattened even more than that of the module 1610. As can be seen in the false color image graph, hotspots or striping along the y-axis are minimized. Further, these benefits are achieved with little loss in efficiency. One simulation of the emission of the module 1710 showed an emission efficiency of 97% when compared to the emission of the module 1410

FIGS. 18A-F show close-up views and emission characteristics of a module 1810 including packages 1800 with primary optics 1820. The primary optics 1820 are similar to the primary optics 1720, but with end portions 1826 that are inset from a substrate 1227, such as, for example, by 25 µm. As shown by comparing FIGS. 18E-F to FIGS. 17E-F, the emission characteristics are substantially similar. One simulation of the emission of the module 1810 showed an emission efficiency of 97.2% when compared to the emission of the module 1410.

FIGS. 19A-F show close-up views and emission characteristics of a module 1910 including packages 1900 with primary optics 1920. The primary optics 1920 are similar to the primary optics 1820, but have side walls 1926 that are angled slightly inward and comprise fillets 1924 instead of sharp edges. The fillets 1924 can, for example, have a radius of 150 µm. As shown by comparing FIGS. 19E-F to FIGS. 18E-F, the emission characteristics are substantially similar. One simulation of the emission of the module 1910 showed an emission efficiency of 95.5% when compared to the emission of the module 1410.

FIGS. 20A-F show close-up views and emission characteristics of a module 2010 including packages 2000 with primary optics 2020. The primary optics 2020 are similar to the primary optics 1920, but the primary optic 2020 is offset upward by a flat portion 2021 which can be, for example, about 90 µm high. As shown by comparing FIGS. 20E-F to FIGS. 19E-F, the emission characteristics are substantially similar. One simulation of the emission of the module 2010 showed an emission efficiency of 96.2% when compared to the emission of the module 1410.

The shapes of the primary optics 1920 and 2020 are more realistic to manufacture using injection molding, for example, compared to the optics 1720,1820.

FIGS. 21A-F show close-up views and emission characteristics of a module 2110 including packages 2100 with primary optics 2120. The primary optics 2120 are similar to the primary optics 1220, but the primary optic 2120 has a bottleneck portion 2121 that is approximately 1.8 mm wide (as opposed to the 1.4 mm wide bottleneck portion 1221). As shown by comparing FIGS. 21E-F to FIGS. 17E-F, the emission characteristics are substantially similar. One simulation of the emission of the module 2110 showed an emission efficiency of 96.6% when compared to the emission of the module 1410.

FIGS. 22A-F show close-up views and emission characteristics of a module 2210 including packages 2200 with primary optics 2220. The primary optics 2220 have the shape of an extruded half-cylinder. As shown by comparing FIGS. 21E-F to FIGS. 15E-F, the emission characteristics of the module 2210 are flatter than the module 1410 with hemispherical primary optics 1404 and slightly more uniform. However, the module 2210 does show result in slightly more intense hotspots than embodiments of modules comprising different primary optics. One simulation of the emission of the module 2210 showed an emission efficiency of 95.9% when compared to the emission of the module 1410.

Referring again to the incorporation of secondary optics, such as diffusers, into devices according to the present disclosure, many additional variations are possible. For example, other embodiments of the lighting module may include a spatially-variant transmittance diffuser. In such a diffuser, the transmittance varies locally to compensate for local irradiance/illuminance variations from the discrete LED sources. Such diffusers can exhibit spatial variation in transmittance of >3, or >10, for example. A spatially-variant diffuser may be formed in several ways.

Diffusers used in embodiments of lighting devices according to the present invention can include diffusing or scattering particles ("LSPs") comprising many different materials such as:
  air or gas;
  silica gel;
  zinc oxide (ZnO);
  yttrium oxide ($Y_2O_3$);
  titania ($TiO_2$);
  barium sulfate ($BaSO_4$);
  alumina ($Al_2O_3$);
  fused silica ($SiO_2$);
  fumed silica ($SiO_2$);
  aluminum nitride;
  glass beads;
  zirconium dioxide ($ZrO_2$);
  silicon carbide (SiC);
  tantalum oxide ($TaO_5$);

silicon nitride (Si₃N₄);
niobium oxide (Nb₂O₅);
boron nitride (BN); or
phosphor particles (e.g., YAG:Ce, BOSE)

Other materials not listed can also be used. Various other reflective materials can also be used. Various combinations of materials or combinations of different forms of the same material can be used to achieve a particular scattering effect. For example, in one embodiment some scattering particles can comprise alumina and other scattering particles can comprise titanium dioxide. It is understood that the diffusers can also comprise mixtures of scattering particles made of different materials.

Using one method, particles affecting light such as reflectors or scatterers may be embedded in a clear binder such as silicone, glass, or plastic, for example. The reflector may comprise silver, titania, alumina or silica, for example. The light scatterer may comprise alumina, titania, or air bubbles, for example. FIG. 23A shows a diffuser 2300. The particles may be varied by varying the thickness 2301 of the diffuser sheet 2300 as shown in FIG. 23A, such that the diffuser sheet 2300 comprises areas of high light transmission 2302 and low light transmission 2304. The particles can be further varied by varying the loading percentage of the particles in the diffuser sheet as shown in FIG. 23B, which depicts a diffuser sheet 2350, comprising areas of low loading percentage 2352 (and thus higher transmissivity) and areas of high loading percentage 2354 (and thus lower transmissivity).

Using another method, a spatially-variant transmittance diffuser can be formed with a coating on a clear or uniformly scattering diffuser or sheet. As shown in FIG. 24A, the thickness of the coating on the diffuser sheet 2400 is varied. In FIG. 24B, the loading percentage of the coating is varied across the diffuser sheet 2420. In FIG. 24C, the diffuser sheet 2440 can be "digitally" graded using dots 2442 (or other patterns) of substantially opaque reflective material, so that the average transmittance of a particular region is different from surrounding regions. In this way, the transmittance varies according to the patterning details such that there are areas of higher transmissivity 2444 where there are fewer dots 2442 and then there are areas of lower transmissivity 2446 in areas with a higher dot concentration. By defining the pattern at a very fine pitch, the human eye cannot discern the digital nature of the coating, giving the appearance of a continuously varying transmittance. These dots 2442 can also comprise reflective or partially reflective properties. In some embodiments these dots 2442 can be partially reflective opaque diffusive dots.

Using yet another method, a spatially-variant transmittance diffuser can be formed by filling a pre-patterned clear (or slightly diffusive or reflective) sheet with materials that can interact with light, such as heavily scattering diffuser regions or reflector regions. One embodiment of the pre-patterned sheet 2500 is shown in FIG. 25A that has areas for accepting a material that interacts with light 2502. In embodiments where this area 2502 is filled with a scatterer, regions of lower light transmissivity 2504 and regions of higher light transmissivity 2506 can be formed. A digital version of the pre-patterned sheet 2550 is shown in FIG. 25B where the pits can be clustered in various regions 2552, similarly as the dots 2442 were clustered in the embodiment in FIG. 24C. This results in the formation of areas of lower light transmissivity 2554 and areas of higher light transmissivity 2556.

The diffuser sheets can be fabricated using various materials, including, for example: glass, plastics, silicones, and ceramics. The diffuser sheets can also be fabricated using White97™ from WhiteOptics, LLC, polytetrafluoroethylene (Teflon®), polycarbonate materials and acrylic.

The reflectors can comprise various materials, including, for example: silver, titania, alumina, or silica. The reflectors can also comprise a specific shape to direct light in a specific direction, for example obliquely or out of the side of a light emitting device.

Various methods of patterning can be used, including, for example: molding (injection, panel), stencil printing, dispense, spray coating, and mechanical (polishing/grinding).

It is understood that embodiments presented herein are meant to be exemplary. Embodiments of the present invention can comprise any combination of compatible features shown in the various figures, and these embodiments should not be limited to those expressly illustrated and discussed. Although the present invention has been described in detail with reference to certain preferred configurations thereof, other versions are possible. Therefore, the spirit and scope of the invention should not be limited to the versions described above.

We claim:

1. A light emitting device module, comprising:
a mount surface;
a plurality of light emitting diode (LED) packages on said mount surface configured to emit a portion of light in a lateral direction;
a diffuser over said plurality of LED packages;
wherein the ratio of the distance between each of said LED packages to the distance from said mount surface to said diffuser is 2:1 or greater.

2. The light emitting device module of claim 1, wherein said mount surface is reflective.

3. The light emitting device module of claim 1, wherein each of said LED packages comprises a primary optic shaped to spread light in a lateral direction.

4. The light emitting device module of claim 1, wherein the distance from said mount surface to said diffuser is equal to or less than 20 mm.

5. The light emitting device module of claim 1, wherein the distance from said mount surface to said diffuser is equal to or less than 10 mm.

6. The light emitting device module of claim 1, wherein the distance from said mount surface to said diffuser is substantially less than the distance between said LED packages.

7. The light emitting device module of claim 1, wherein the distance between said LED packages about 25 mm or greater.

8. The light emitting device module of claim 1, wherein the distance between said LED packages about 34 mm or greater.

9. The light emitting device module of claim 1, wherein said ratio is 3:1 or greater.

10. The light emitting device of claim 1, wherein said LED package emits light substantially symmetrical about its central axis.

11. A light emitting device module, comprising:
a housing comprising a reflective back surface and an open end;
a plurality of LEDs on said back surface;
a primary optic on each of said LEDs, said primary optic shaped to spread a portion of the light emitted from said at least one LED in a lateral direction; and
a secondary optic spaced away from said primary optic at said housing open end such that substantially all the light emitted from said LEDs interacts with said secondary optic before exiting said light emitting device module, wherein the ratio of the distance between each of said LEDs to the distance from said back surface to said secondary optic is 2:1 or greater.

12. The light emitting device module of claim 11, wherein said secondary optic comprises a diffuser.

13. The light emitting device module of claim 11, wherein said secondary optic comprises a lens.

14. The light emitting device module of claim 11, wherein said secondary optic comprises a diffuser having non-uniform diffusive characteristics.

15. A light emitting device module, comprising:
a housing comprising a reflective back surface and an open end;
a plurality of LEDs on said back surface;
a primary optic on each of said LEDs; and
a secondary optic spaced away from said primary optic at said housing open end such that substantially all the light emitted from said LEDs interacts with said secondary optic before exiting said light emitting device module, wherein said secondary optic comprises a diffuser comprising partially reflective, substantially opaque diffusive dots.

16. The light emitting device module of claim 11, wherein said secondary optic comprises embedded isotropic diffusive disks.

17. The light emitting device module of claim 11, wherein said primary optic comprises at least partially cylindrical body.

18. The light emitting device module of claim 11, wherein said primary optic comprises at least one concave portion.

19. The light emitting device module of claim 11, wherein said primary optic comprises at least one truncated cone.

20. The light emitting device module of claim 11, wherein said primary optic comprises two truncated cones attached at their apical top planes and then bisected at a plane along its height.

21. The light emitting device module of claim 11, wherein said primary optic comprises a 150 µm fillet.

22. The light emitting device module of claim 11, wherein the distance from said back surface to said diffuser is equal to or less than 20 mm.

23. The light emitting device module of claim 11, wherein the distance from said back surface to said diffuser is equal to or less than 10 mm.

24. The light emitting device module of claim 11, wherein the distance between said LEDs is greater than about 25 mm.

25. The light emitting device module of claim 11, wherein the distance between said LEDs is greater than about 34 mm.

26. A light emitting device, comprising:
an elongated housing having a length and comprising a reflective back surface;
a plurality of light emitting diodes (LEDs) on said back surface;
a primary optic on each of said LEDs, said primary optics shaped to spread a portion of the light emitted from said LEDs along the length of said housing; and
diffuser element spaced away from said primary optic arranged to interact with light emitted from said LEDs and said primary optics,
wherein the ratio of the distance between each of said LEDs to the distance from said back surface to said diffuser element is 2:1 or greater.

27. The light emitting device of claim 26, wherein each of said primary optics comprises a concave portion.

28. The light emitting device of claim 26, wherein each of said primary optics comprises a bottleneck portion.

29. The light emitting device of claim 26, wherein each of said primary optics is substantially bow-tie shaped.

30. The light emitting device of claim 26, wherein each of said primary optics comprises two truncated cone portions attached at their apical top planes and then bisected at a plane along its height.

31. The light emitting device of claim 26, wherein the distance from said back surface to said diffuser is equal to or less than 20 mm.

32. The light emitting device of claim 26, wherein the distance from said back surface to said diffuser is equal to or less than 10 mm.

33. The light emitting device of claim 26, wherein the distance from said back surface to said diffuser is substantially less than the distance between said LEDs.

34. The light emitting device of claim 26, wherein the distance between said LEDs is greater than about 25 mm.

35. The light emitting device of claim 26, wherein the distance between said LEDs is greater than about 34 mm.

* * * * *